United States Patent
Chan et al.

(10) Patent No.: US 11,616,476 B2
(45) Date of Patent: Mar. 28, 2023

(54) POWER AMPLIFIER CIRCUIT

(71) Applicant: City University of Hong Kong, Kowloon (HK)

(72) Inventors: Wing Shing Chan, Kowloon (HK); Xin Yu Zhou, Kowloon (HK)

(73) Assignee: City University of Hong Kong, Kowloon (HK)

( * ) Notice: Subject to any disclaimer, the term of this patent is extended or adjusted under 35 U.S.C. 154(b) by 82 days.

(21) Appl. No.: 17/073,542

(22) Filed: Oct. 19, 2020

(65) Prior Publication Data

US 2022/0123694 A1    Apr. 21, 2022

(51) Int. Cl.
| | | |
|---|---|---|
| *H03F 1/02* | (2006.01) | |
| *H03F 1/42* | (2006.01) | |
| *H03F 3/21* | (2006.01) | |
| *H03F 1/56* | (2006.01) | |
| *H04B 1/04* | (2006.01) | |

(52) U.S. Cl.
CPC ............ *H03F 1/42* (2013.01); *H03F 1/0288* (2013.01); *H03F 1/565* (2013.01); *H03F 3/21* (2013.01); *H03F 2200/36* (2013.01); *H03F 2200/387* (2013.01); *H04B 1/04* (2013.01)

(58) Field of Classification Search
CPC .......... H03F 1/42; H03F 1/0288; H03F 1/565; H03F 3/21; H03F 2200/36; H03F 2200/387; H04B 1/04
USPC ............................................. 330/124 R, 295
See application file for complete search history.

(56) References Cited

U.S. PATENT DOCUMENTS

| | | | |
|---|---|---|---|
| 8,497,744 B1 * | 7/2013 | Wright | ..................... H03H 7/38 333/32 |
| 10,320,335 B1 | 6/2019 | Jang et al. | |
| 10,355,647 B2 | 6/2019 | Datta et al. | |
| 10,483,918 B2 | 11/2019 | Jin et al. | |
| 10,491,165 B2 | 11/2019 | Gaynor | |
| 10,511,265 B2 | 12/2019 | Ai et al. | |
| 10,541,653 B2 | 1/2020 | Zhu et al. | |
| 10,601,375 B2 | 3/2020 | Grebennikov et al. | |
| 10,608,594 B2 | 3/2020 | Komatsuzaki et al. | |
| 10,630,242 B2 | 4/2020 | McLaren | |
| 10,686,408 B2 | 6/2020 | Jiang | |
| 2002/0135425 A1 * | 9/2002 | Kim | ........................ H03F 3/604 330/295 |
| 2004/0000948 A1 * | 1/2004 | Stengel | ................. H03F 1/0266 330/136 |
| 2012/0025916 A1 * | 2/2012 | Deguchi | ............... H03F 1/0244 330/295 |

(Continued)

FOREIGN PATENT DOCUMENTS

| | | |
|---|---|---|
| CN | 111010092 | 4/2020 |
| CN | 111030620 | 4/2020 |
| CN | 111181509 | 5/2020 |

(Continued)

*Primary Examiner* — Hafizur Rahman
*Assistant Examiner* — Khiem D Nguyen
(74) *Attorney, Agent, or Firm* — Renner Kenner Greive Bobak Taylor & Weber

(57) ABSTRACT

A power amplifier circuit includes a first impedance transformer circuit arranged to connect with a carrier device, and a second impedance transformer circuit arranged to connect with a peaking device. Both the first and the second impedance transformer circuit include a parallel impedance transformer arrangement.

19 Claims, 24 Drawing Sheets

(56) References Cited

U.S. PATENT DOCUMENTS

2018/0167042 A1\* 6/2018 Nagasaku ............... H03F 3/195

FOREIGN PATENT DOCUMENTS

| CN | 210490802 | 5/2020 |
| CN | 111384901 | 7/2020 |

\* cited by examiner

POWER AMPLIFIER CIRCUIT

TECHNICAL FIELD

The invention relates to a power amplifier circuit, and particularly, although not exclusively, to an ultra-wideband power amplifier circuit for use in communication systems.

BACKGROUND

In wireless communication systems, power amplifier (PA), may be used in base station transmitters. The additional efficiency peak at output back-off (OBO) provided by DPA matches with the large peak to average power ratio (PAPR) of signal formats currently being used. However, with the adoption of multi-input multi-output (MIMO) and carrier aggregation (CA) techniques, the bandwidth required for base station PAs may be increased significantly.

For example, in 4G and 5G communications system, the base stations may be required to support wide bandwidth communication so as to boost the system throughputs or transmission rates thereby to facilitate various applications and data transfers among multiple communication devices serviced by the base stations. It may be more preferable to have the components operating in broadband/ultra-wideband.

SUMMARY OF THE INVENTION

In accordance with a first aspect of the invention, there is provided a power amplifier circuit comprising: a first impedance transformer circuit arranged to connect with a carrier device; and a second impedance transformer circuit arranged to connect with a peaking device; wherein both the first and the second impedance transformer circuit include a parallel impedance transformer arrangement.

In an embodiment of the first aspect, the parallel impedance transformer arrangement comprises a left-handed network paralleled with a right-handed network.

In an embodiment of the first aspect, the left-handed network is an artificial left-handed quasi-lumped component network and the right-handed network is an L-typed right-handed microstrip network.

In an embodiment of the first aspect, the left-handed network comprises a $C_1$-$L_1$-$C_2$ LC network, In an embodiment of the first aspect, the right-handed network of the first impedance transformer circuit comprises an $L_0$-$C_0$ LC network, wherein $C_0$ is a grounded capacitor.

In an embodiment of the first aspect, the inductor $L_0$ and the capacitor $C_0$ are arranged to minimize a phase dispersion of the right-handed network.

In an embodiment of the first aspect, an inductance value of $L_0$ and a capacitance value of $C_0$ in the first impedance transformer circuit combine to define a relationship of:

$$C_0 = \frac{2}{L_0} + L_0 + \frac{\sqrt{2}-4}{2}$$

In an embodiment of the first aspect, the left-handed network of the second impedance transformer circuit comprises an inductor $L_0$ connected to a microstrip line followed by a grounded capacitor $C_0$.

In an embodiment of the first aspect, the inductor $L_0$ and the capacitor $C_0$ are arranged to minimize a phase dispersion of the right-handed network only in a single load condition at saturation where both the carrier device and the peaking device are conducting.

In an embodiment of the first aspect, the power amplifier further comprises a phase tuning line connected to an output of each of the first and the second impedance transformer circuits.

In an embodiment of the first aspect, in a carrier branch defined by the first impedance transformer circuit and a first phase tuning line, the first phase tuning line has a characteristic impedance of $R_{carrier}$ at saturation.

In an embodiment of the first aspect, in a peaking branch defined by the second impedance transformer circuit and a second phase tuning line, the second phase tuning line has a characteristic impedance of $R_{peaking}$ at saturation.

In an embodiment of the first aspect, each of the phase tuning lines includes an inductor.

In an embodiment of the first aspect, the power amplifier further comprises a post matching network connected to an output of a load modulation network defined by a combination of the first and the second impedance transformer circuit.

In an embodiment of the first aspect, the post matching network has a stepped impedance topology.

In an embodiment of the first aspect, the power amplifier further comprises an input connector arranged to provide input signals fed to both the carrier device and the peaking device, and an output connector arranged to output signals from the post matching network.

In an embodiment of the first aspect, the first impedance transformer circuit and the second impedance transformer circuit combine to define a Doherty Power Amplifier topology.

In an embodiment of the first aspect, the carrier device and the peaking device are transistors.

In an embodiment of the first aspect, the power amplifier is arranged to operate with a wide bandwidth of 60%.

In an embodiment of the first aspect, the power amplifier has at least 40% drain efficiency at 6-dB back-off point.

BRIEF DESCRIPTION OF THE DRAWINGS

Embodiments of the invention will now be described, by way of example, with reference to the accompanying drawings in which.

DETAILED DESCRIPTION OF THE PREFERRED EMBODIMENT

Figure 1:
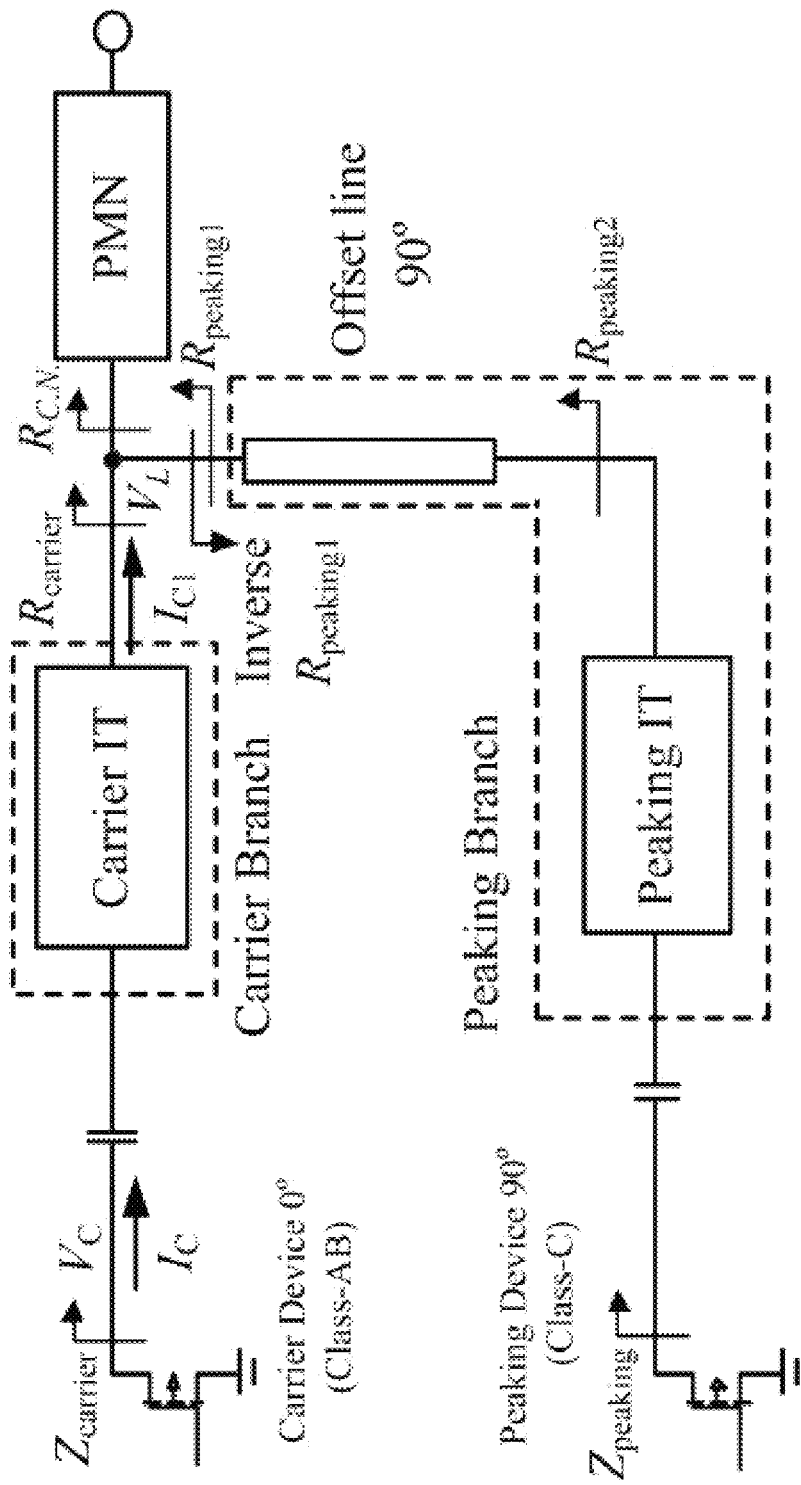
FIG. 1 is a schematic diagram showing an example output stage of a broadband DPA.

The inventors have, through their own research, trials and experiments, devised that Doherty Power Amplifiers (DPA) may be used for wideband applications. For example, a transformer-less load-modulated DPA architecture may be used to extend the bandwidth. This architecture neither requires a λ/4 microstrip line impedance transformer (IT), nor offset lines, which may contribute to the main limiting factors in designing wideband Doherty amplifiers.

In an ultra-wideband DPA example, a DPA based on an input/output splitting/combining networks, may be used to overcame the factors that had limited the bandwidth of conventional DPAs. In this example, the closed-form formulation may be suitable for direct synthesis of ultra-wideband DPAs.

High-power wideband Doherty amplifiers may allow fractional bandwidths >50%. In this example, the DPA uses wideband impedance inverters together with a wideband capacitance compensation and matching strategy.

Alternatively, a constant current source may be used to provide the bias for the transistor. The transistors may have completely different behaviors compared to conventional voltage biasing scheme. Preferably, a reversed load modulation may be adopted, which may result in a reversed modulation dual branch amplifier structure suitable for ultra-wideband and high efficiency at output back-off.

In an alternative power combining architecture, a distributed efficient power amplifier mitigates the inherent bandwidth limiting factors in a DPA. Impedance inversion and load modulation may be realized by distributing the conventional peaking amplifier of the DPA into multiple peaking sub amplifiers along a broadband multi-section impedance transformer.

To further improve the PAs, in one example, by determining the desired minimum phase delay of the carrier and peaking output matching networks, the bandwidth may be extended. However, the minimum phase delay also resulted in the loss of load modulation bandwidth, which limited further increase in bandwidth.

In an example broadband DPA with 87% bandwidth, it may be obtained by a simplified approach for the initial bandwidth estimation that only required linear simulations. In particular, the equivalent impedance of the Doherty inverter may be determined by the value of the output capacitance of the power device. The Doherty combiner may be designed following this initial choice by using a microstrip network. Preferably, the right/left-handed transmission lines, due to its negative phase dispersion characteristic, may be used for broadband circuit designs. It is devised by the inventors that the design approach may be applied in phase shifters, couplers, and DPAs.

Preferably, a DPA may use composite right/left handed transmission lines (CRLH-TL) for improving linearity. In this example, the λ/4 transmission line incorporating CRLH-TL may be adopted to suppress the second harmonic of the output of the main amplifier. However, the enhanced performance may be limited to a narrow bandwidth.

Referring to FIG. 1, there is shown a schematic diagram of an output stage of an example broadband DPA. In this example, the DPA consists of two microstrip ITs for both carrier and peaking devices with 90° phase difference, one 90° offset line and a post matching network (PMN). $Z_{carrier}$ and $Z_{peaking}$ refers to the drain impedance of carrier and peaking devices respectively as seen towards the combining node. While $R_{carrier}$ and $R_{peaking1}$ represents the output impedance (zero reactance) of the carrier and peaking branches, respectively. $R_{peaking2}$ represents the output impedance of the peaking IT. $R_{C.N.}$ is the impedance at the combining node (C.N). "Inverse $R_{peaking1}$" represents the output impedance of peaking branch seen towards the drain of the active device.

Ideally, for the fundamental load conditions, the following needs to be satisfied;

At the Back-off point, $$R_{carrier}@f=R_L; \text{Inverse } R_{peaking1}@f=\infty \quad (1)$$

At saturation, $$R_{carrier}@f=2R_L; R_{peaking1}=R_{peaking2}@f=2R_L \quad (2)$$

At the back-off point, only the carrier device is conducting ($R_{carrier}=R_{C.N.}=R_L$). Whereas, Inverse Rpeaking1, should be infinite to prevent power leakage from the carrier branch. At saturation, both carrier and peaking devices are conducting. $R_{carrier}$, $R_{peaking1}$ and $R_{peaking2}$ are all $2R_L$ in order to maintain an $R_{C.N.}$ impedance of $R_L$. The offset line is necessary and placed after the output of the peaking IT to compensate for the 90° phase difference, and their impedance should be equal to $2R_L$ in order to prevent power loss. After this, the PMN transforms the "real-to-real" impedance transformation from system load ($R_0$) to combining node ($R_{C.N.}$). To meet these kinds of load conditions, the S parameters of the lossless reciprocal carrier and peaking IT are represented by $S_{11}$ and the phase of $S_{21}$ ($\theta_{21}$).

To design the carrier IT, the following equations can be obtained, i.e.:

$$\begin{bmatrix} V_C \\ I_C \end{bmatrix} = \begin{bmatrix} A_C & B_C \\ C_C & D_C \end{bmatrix} \begin{bmatrix} V_L \\ I_{C1} \end{bmatrix} \quad (3)$$

In the design process, the optimum values for the four impedances, i.e., $Z_{carrier,sat}$, $R_{carrier,sat}$, $Z_{carrier,low}$ and $R_{carrier,low}$ can be determined by using load-pull measurements or simulation. $S_{11}$ and $\theta_{21}$ can then be obtained from the matrix expression in (3). While for the peaking IT, its matching condition focuses on saturation, which is relatively simple with minimal $\theta_{21}$ also required.

Figure 2:
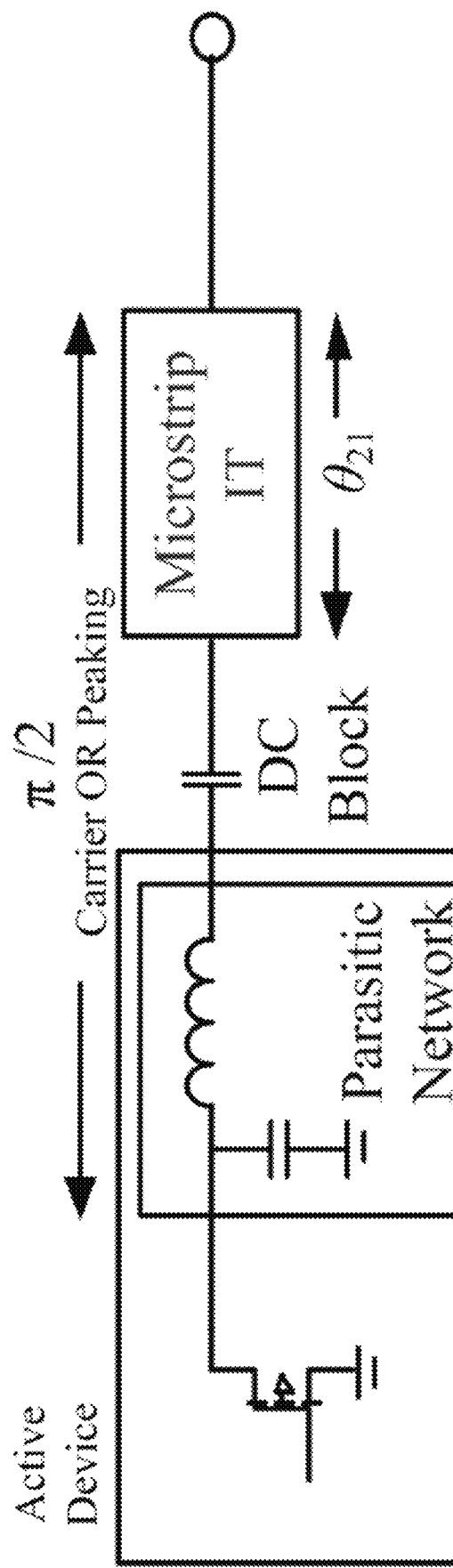
FIG. 2 is a schematic diagram showing a matching scheme of an example microstrip IT.

Preferably, the ideal electrical length of the carrier and peaking IT (parasitic network+microstrip IT) should be $\pi/2$, which is shown in FIG. 2. However, in practice, parasitics as shown in the parasitic network of the active device is inevitable, and contributes to electrical length. Hence, the microstrip IT needs to be designed carefully in order to satisfy the $\pi/2$ phase requirement. It should be emphasized that, due to the periodicity of the exponential function, a series of $\theta_{21}$ satisfy the phase requirement. To minimize the phase delay dispersion over the whole frequency band for wideband operation, only the minimum value of $\theta_{21}$ should be chosen.

However, the required minimum $\theta_{21}$ has the negative effect on the load modulation bandwidth of the carrier IT ($S_{11}$ of carrier IT under the load conditions at back-off and saturation), which limits any further extension of the DPA bandwidth. This opposing effects need to be resolved in order to achieve any improvement in bandwidth.

In accordance with the embodiments of the present invention, there is provided impedance transformer (IT) for used in Doherty-like PAs based on a paralleled right- and left-handed network. Advantageously, the IT achieve minimum phase delay but not at the expense of load modulation bandwidth, thereby resulting in a wider bandwidth.

The inventors devise that minimum phase delay and maximum load modulation bandwidth may be achieved simultaneously to extend the DPA bandwidth according to the embodiments of the present invention. Compared with other example microstrip quarter-wavelength ITs, the opposing requirements of phase delay and matching bandwidth is reduced significantly.

Figure 3:
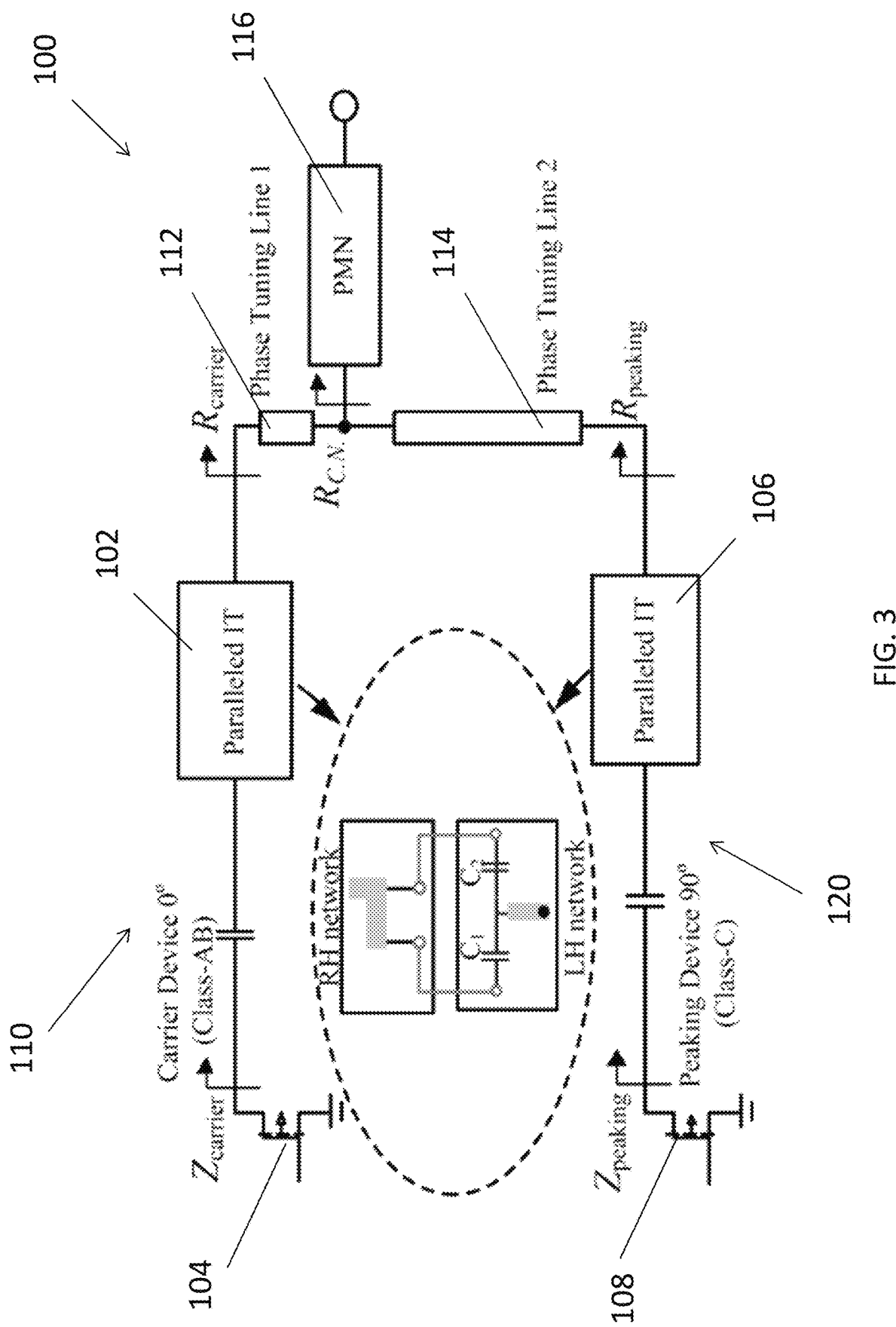
FIG. 3 is a schematic diagram showing an output of a broadband Doherty-like PA in accordance with an embodiment of the present invention.

With reference to FIG. 3, there is shown an example embodiment of a power amplifier circuit 100 comprising: a first impedance transformer circuit 102 arranged to connect with a carrier device 104; and a second impedance transformer circuit 106 arranged to connect with a peaking device 108; wherein both the first and the second impedance transformer circuit include a parallel impedance transformer arrangement.

In this embodiment, the power amplifier circuit 100 comprises two main branches, namely a carrier branch 110 and a peaking branch 120, arranged in a parallel configuration. In each of the branches, an impedance transformer (IT) circuit is included to connect with an electronic device, such as a transistor in which the gate may be modulated by an electrical signal.

For simplicity, the transistor in the carrier branch 110 may be referred as a carrier device 104, and the transistor in the peaking branch 120 may be referred as a peaking device 108. Any type of transistors, such as but not limited to bipolar junction transistor or field effect transistor may be connected to the paralleled IT in the branches. In such configuration, the power amplifier 100 may be considered as "Doherty-like" and in the disclosure is also referred as a Doherty Power Amplifier or a DPA.

Preferably, both the first and the second impedance transformer circuit include a parallel impedance transformer arrangement. As shown in FIG. 3, the output side of the broadband Doherty-like PA consists of two ITs for both the carrier and peaking devices, and the ITs are comprised of an L-type right-handed microstrip network, which is in parallel with an artificial left-handed quasi-lumped component network.

In addition, the power amplifier comprises two phase tuning lines 112, 114 and a post matching network (PMN) 116, which will be further described later in this disclosure.

Figures 4A, 4B:
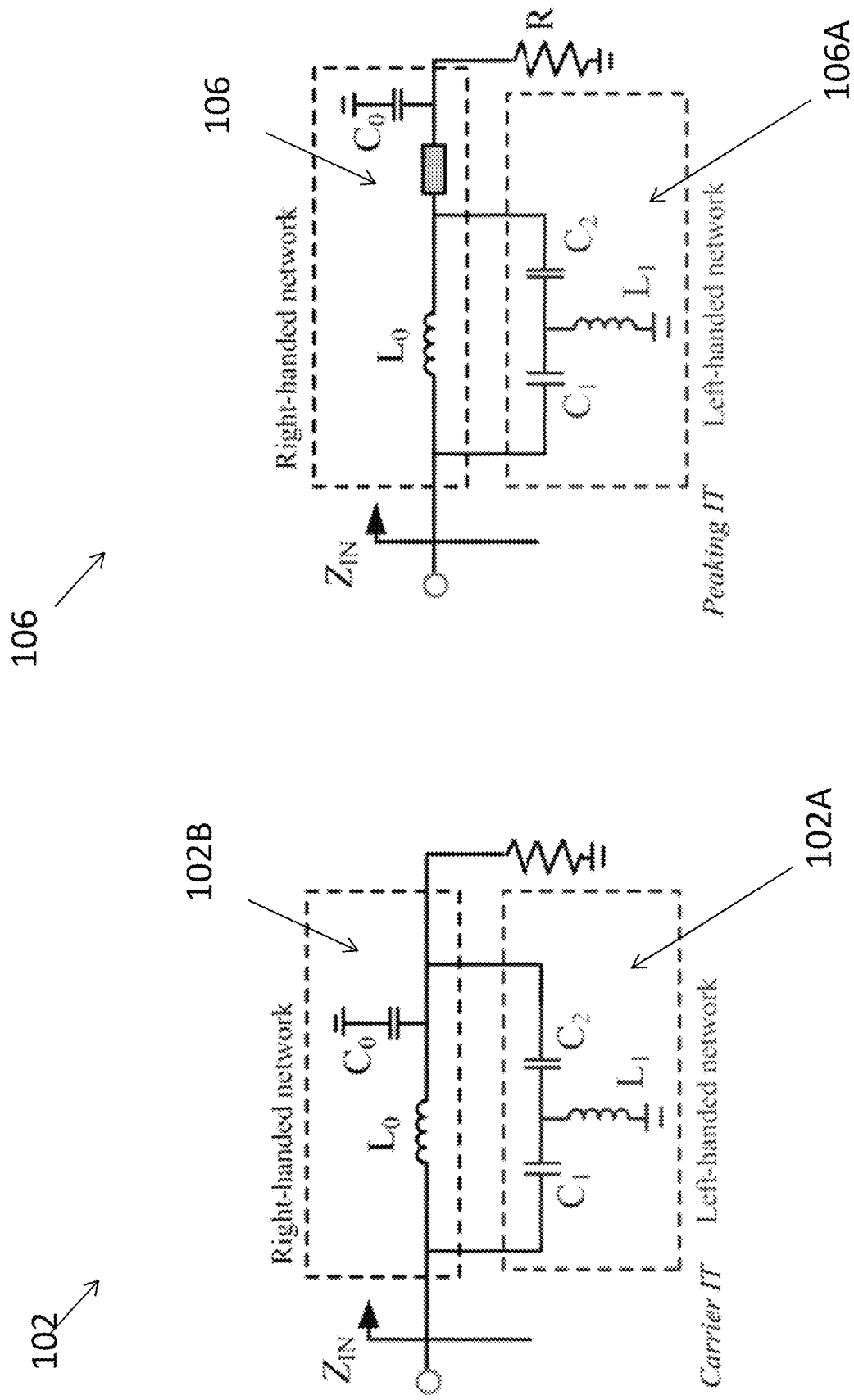
FIGS. 4A and 4B are schematic diagrams shown equivalent circuit of parallel right- and left-handed ITs for carrier and peaking device respectively.

With reference also to FIG. 4, in both the first and the second IT circuit of two branches, the left-handed network 102A, 106A comprises a $C_1$-$L_1$-$C_2$ LC network, however, the right-handed networks in the two ITs are different. Preferably, the right-handed network 102B of the first impedance transformer circuit 102 in the carrier branch 110 comprises an $L_0$-$C_0$ LC network, wherein $C_0$ is a grounded capacitor, with the $C_1$-$L_1$-$C_2$ network connected to two terminal ends of the $L_0$-$C_0$ LC network, whereas in the second impedance transformer circuit 106 in the peaking branch 120, the right-handed network 106B of the second impedance transformer circuit comprises an inductor $L_0$ connected to a microstrip line followed by a grounded capacitor $C_0$, and the $C_1$-$L_1$-$C_2$ network connected to two ends of the inductor $L_0$.

The admittance matrix of a conventional L-type IT ($L_0$-$C_0$ can be expressed by [$Y_1$], while [$Y_2$] represents the admittance matrix of the left-handed network ($C_1$-$L_1$-$C_2$). Hence, the overall [$Y_{IN}$] matrix of the IT can be written as (4)

$$Y_{IN} = Y_1 + Y_2 = \begin{pmatrix} j\left(\frac{\omega C_1(1-\omega^2 L_1 C_2)}{1-\omega^2 L_1(C_1+C_2)} + \frac{1}{\omega L_0}\right) & j\left(\frac{\omega^3 C_1 C_2 L_1}{(1-\omega^2 L_1 C_2 + \omega^2 L_1 C_1)} - \frac{1}{\omega L_0}\right) \\ j\left(\frac{\omega^3 C_1 C_2 L_1}{(1-\omega^2 L_1 C_2 + \omega^2 L_1 C_1)} - \frac{1}{\omega L_0}\right) & j\left(\omega C_0 - \frac{1}{\omega L_0} + \frac{\omega C_2(1-\omega^2 L_1 C_1)}{1-\omega^2 L_1(C_1+C_2)}\right) \end{pmatrix}$$

Here, $R_L$ and $\omega$ are set to 1 for more easily analyzing the center frequency. In addition, three parameters, a, b and c are defined as:

$$a = Y_{IN,12}Y_{IN,21}, b = Y_{IN,11}/j, c = Y_{IN,22}/j \quad (5)$$

In terms of $\theta_{21}$ of the IT, its minimum phase delay is achieved by using the paralleled right-handed and left-handed network, which can be expressed by:

$$\theta_{21} = \angle\frac{-2Y_{IN,21}Y_L}{\Delta Y} = \arctan\left(\frac{Y_C^2 - bc - a}{b + c}\right) \quad (6)$$

where YL and $\Delta Y$ can be expressed by:

$$Y_L = 1/R_L, \Delta Y = (Y_{IN,11} + Y_0)(Y_{IN,22} + Y_0) - Y_{12}Y_{21} \quad (7)$$

At center frequency ($\omega=1$), the simplest method to tune the electrical length of the IT is to adjust the electrical length of the right-handed network. However, the phase and impedance matching condition is a function of the left-handed network. To make it independent, based on (4), by setting component values ($C_1$, $C_0$, $L_1$) in the left-handed network to 1, this results in the corresponding $[Y_{IN}]$ matrix of the IT to be simplified.

$$Y_{IN} = Y_1 + Y_2 = \begin{pmatrix} j\left(\frac{1}{L_0}\right) & j\left(1 - \frac{1}{L_0}\right) \\ j\left(1 - \frac{1}{L_0}\right) & j\left(C_0 - \frac{1}{L_0}\right) \end{pmatrix} \quad (8)$$

then, (6) can be simplified as $$\theta_{21} = \arctan\left(\frac{Y_L^2 + 1}{C_0} - \frac{C_0 + 2}{C_0 L_0} + \frac{2}{C_0 L_0^2}\right) \quad (9)$$

Preferably, the minimal $\theta_{21}$ which satisfies the $\pi/4$ phase requirement for the carrier branch can be easily obtained by the proper tuning of $C_0$ and $L_0$ in the right-handed network.

Apart from the minimal phase at $\omega=1$, the other requirement is the phase difference of the IT should also be minimal over the entire operating frequency band. This results in a broadband characteristic, which can be expressed as:

$$\text{Minimal}|\Delta\theta_{21}| = |\theta_{21\_fhigh} - \theta_{21\_flow}| \quad (10)$$

Here, $\omega$ is set over a range from 0.7 to 1.3. Substituting $C_1 = C_2 = L_1 = 1$ into (4), the $[Y_{IN}]$ matrix of the IT for $\omega=0.7$ and $\omega=1.3$ can be written as:

$$Y_{IN0.7} = \quad (11)$$

$$Y_{1,0.7} + Y_{2,0.7} = \begin{pmatrix} j\left(17.85 + \frac{1}{0.7L_0}\right) & j\left(0.343 - \frac{1}{0.7L_0}\right) \\ j\left(0.343 - \frac{1}{0.7L_0}\right) & j\left(0.7C_0 - \frac{1}{0.7L_0} + 17.85\right) \end{pmatrix}$$

$$Y_{IN1.3} = \quad (12)$$

$$Y_{1,1.3} + Y_{2,1.3} = \begin{pmatrix} j\left(0.376 + \frac{1}{1.3L_0}\right) & j\left(2.197 - \frac{1}{1.3L_0}\right) \\ j\left(2.197 - \frac{1}{1.3L_0}\right) & j\left(1.3C_0 - \frac{1}{1.3L_0} + 0.376\right) \end{pmatrix}$$

Calculating the corresponding $\theta_{21}$ to get $\Delta\theta_{21}$, $$|\Delta\theta_{21}| = |\theta_{21,1.3} - \theta_{21,0.7}| = \left|\angle\frac{-2Y_{IN1.3,21}Y_L}{\Delta Y_{1.3}} - \angle\frac{-2Y_{IN0.7,21}Y_L}{\Delta Y_{0.7}}\right| \quad (13)$$

Ideally, the minimal $\Delta\theta_{21}$ is "zero", which requires the condition: $\theta_{21}, 1.3 = \theta_{21}, 0.7$. In practice it may be impossible to realize $\Delta\theta_{21} = 0$ due to the inevitable phase dispersion of the microstrip line network. However, to analyze such kind of condition can help to find the dominant component in the IT in order to achieve minimal phase dispersion according to a preferred embodiment of the present invention.

According to (6), the $\theta_{21}, 1.3$ and $\theta_{21}, 0.7$ can be further extended as:

$$\theta_{21,1.3} = \arctan\frac{Y_L^2 - \left(0.376 + \frac{1}{1.3L_0}\right)\left(1.3C_0 - \frac{1}{1.3L_0} + 0.376\right) + \left(2.197 - \frac{1}{1.3L_0}\right)^2}{0.752 + 1.3C_0} \quad (14)$$

$$\theta_{21,0.7} = \arctan\frac{Y_L^2 - \left(17.85 + \frac{1}{0.7L_0}\right)\left(0.7C_0 - \frac{1}{0.7L_0} + 17.85\right) + \left(0.343 - \frac{1}{0.7L_0}\right)^2}{35.7 + 0.7C_0} \quad (15)$$

By observing (14), the product of $(0.376+1/1.3L_0)$ $(1.3C_0-1/1.3L_0+0.376)$ and $1/1.3L_0$ are relatively small, which can be ignored. Hence, (14) can be further simplified as $$\theta_{21,1.3} = \arctan\frac{|Y_L^2 - (2.197)^2|}{0.752 + 1.3C_0} \quad (16)$$

By observing (15), the product of $(17.85+1/0.7L_0)$ $(0.7C_0-1/0.7L_0+17.85)$ is roughly the square of 17.85 and the square of $(0.343-1/0.7 L_0)$ is relatively small, which can be ignored. Hence, (15) can be further simplified as $$\theta_{21,0.7} = \arctan\frac{Y_L^2 - (17.85)^2}{35.7 + 0.7C_0} \quad (17)$$

Letting (16) equal to (17), the relationship between $C_0$ and $Y_0$ is given by, $$C_0 = \frac{34.948 Y_L^2 + 67.2}{0.6 Y_0^2 + 410.819} \quad (18)$$

for $\Delta\theta_{21} = 0$

From (18), it can be found the ideal $\Delta\theta_{21}=0$ only happened when $C_0$ and $Y_L$ satisfies a certain condition. It should be noted that (18) aims to disclose the dominant role of $C_0$ and $Y_L$ for the phase dispersion in the carrier IT and the calculated $C_0$ may have few meaning for the design in some embodiments.

Figure 5:
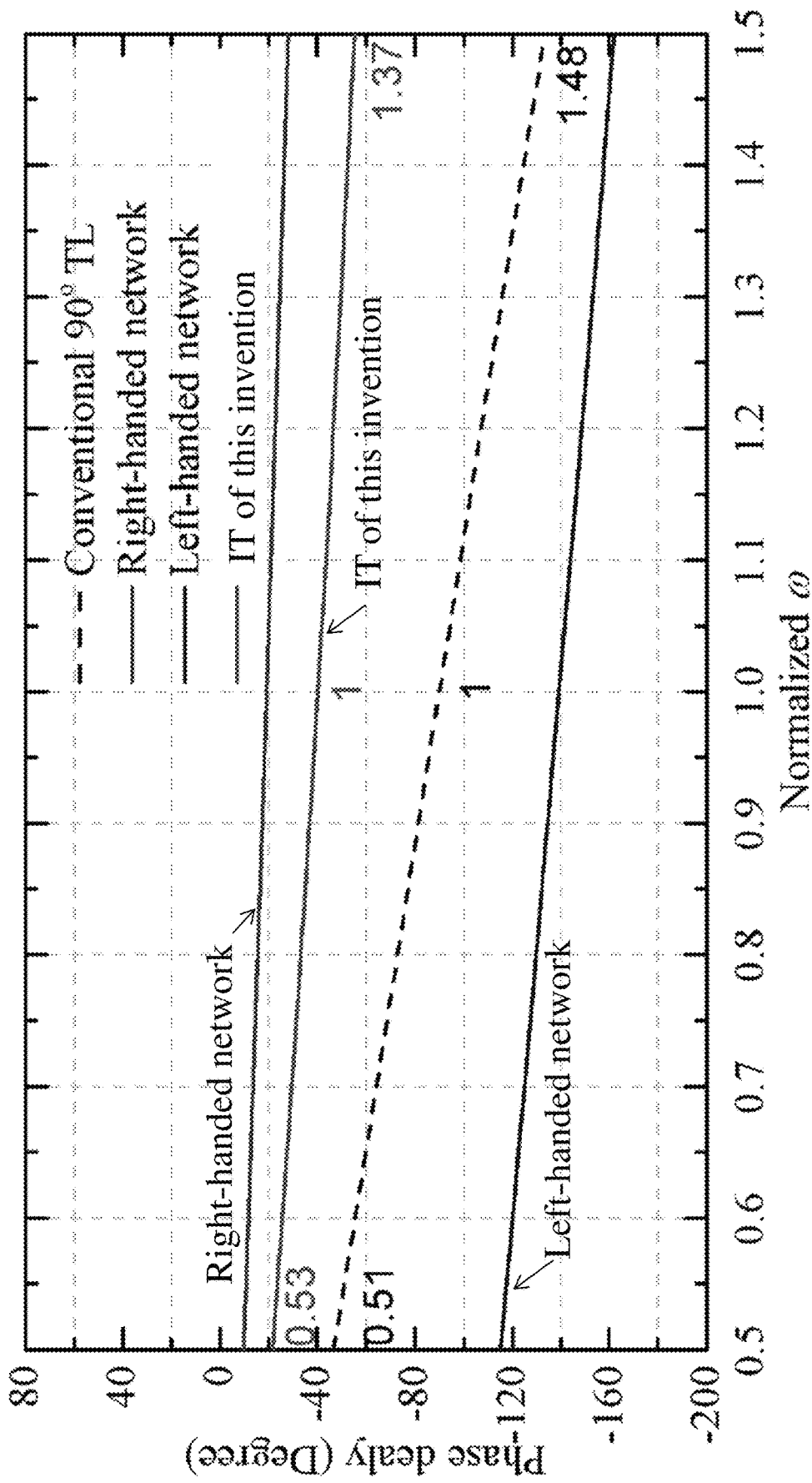
FIG. 5 is a plot showing phase delay of 90° transmission line, right-handed network, left-handed network and carrier IT of FIG. 4A.

The simulated phase delays for a conventional 90° transmission line, a right-handed network, a left-handed network and the employed IT for carrier device in this work are shown in FIG. 5. Here, the phase at $f_0$ is used to normalize the phase dispersion of the conventional transmission lines (TL) and IT in the present invention. It was found that the IT has a smaller variation in phase dispersion (0.53 at $0.5\omega$–1.37 at $1.5\omega$) compared with the conventional TL (0.51 at $0.5\omega$–1.48 at $1.5\omega$).

In terms of $S_{11}$ of the IT, the carrier IT needs to satisfy the load conditions mentioned in (1) and (2) after which $Z_{IN}$ of the carrier IT ($Z_{carrier}$) can be calculated as:

$$Z_{carrier} = \frac{1}{Y_{IN,11} - \frac{Y_{IN,12}Y_{IN,21}}{Y_{IN,22} + 1/R_L}} = \frac{-aR_L}{R_L^2(bc+a)^2 + b^2} - j\frac{b + bc^2R_L^2 + acR_L^2}{R_L^2(bc+a)^2 + b^2} \quad (19)$$

Ideally, the optimal $Z_{carrier}$ has a pure real resistance at the current plane. However, in practice, transistor parasitics cannot be avoided, which results in the optimal $Z_{carrier}$ at the package plane having an imaginary part, which is dependent on the output power.

With increase in output power (from back-off to saturation), the real part of optimal $Z_{carrier}$ remains unchanged while the imaginary part moves towards the real axis. This phenomenon is also verified in simulated load-pull results for the GaN transistor (such as CREE CGH40010F) and will be further proven later in this disclosure. The real part of (19) may be written as:

$$\frac{-aR_L}{R_L^2(bc+a)^2 + b^2}(OBO.) = \frac{-2aR_L}{4R_L^2(bc+a)^2 + b^2}(Sat.) \quad (20)$$

Letting $R_L$=25 ohm, which is the same as the real part of optimal $Z_{carrier}$, then (20) can be simplified as:

$$2(bc+a)^2 = b^2 \quad (21)$$

Due to $C_1$, $C_2$, $L_1$ in the left-handed network having been set to 1, the three defined parameters a, b, and c at the center frequency ($\omega$=1) can be expressed as, $a=-(1-1/L_0)^2$, $b=1/L_0$, $c=C_0-1/L_0$. The relationship between $L_0$ and $C_0$ can then be derived according to (21):

$$C_0 = \frac{2}{L_0} + L_0 + \frac{\sqrt{2} - 4}{2} \quad (22)$$

Moreover, due to the presence of parasitics from the GaN transistor, the imaginary part of optimal $Z_{carrier}$ moves toward the real axis with increase in power from back-off point to saturation. Therefore, the following condition for the imaginary part should be satisfied:

$$\frac{b + bc^2 + ac}{(bc+a)^2 + b^2}(OBO.) > \frac{b + 4bc^2 + 4ac}{4(bc+a)^2 + b^2}(Sat.) \quad (23)$$

Since $L_0$ should satisfy minimum $\theta_{21}$ and by setting $L_0$ to 2 as initial value, which will need further iteration. $C_0$ is then calculated to be 1.7 based on (22).

Figure 6:
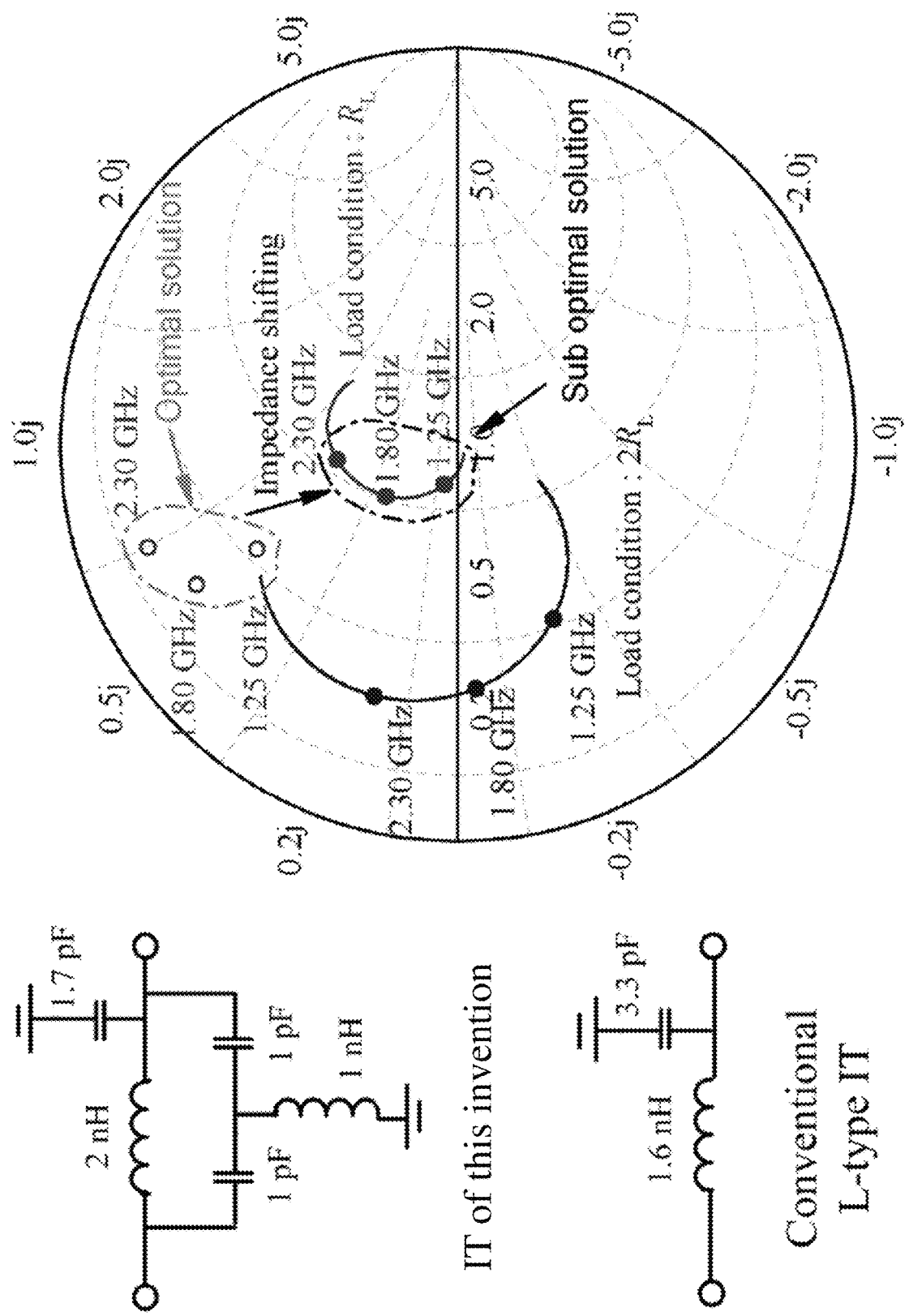
FIG. 6 is an illustration showing simulated $Z_{carrier}$ behaviors of the IT of the present invention in Smith chart under different load conditions.

To verify the behavioral impedance of the IT under load conditions, $R_L$ and $2R_L$, the simulated $Z_{carrier}$ behaviors of the IT is shown plotted on the Smith chart in FIG. 6. For the imaginary part, its value can be seen moving towards the real axis from back-off to saturation, which matches with the requirement in (23). For the real part, in the IT, the optimal solution is not achievable, i.e., invariant real part. This is because with the IT, more emphasis was placed on both the minimum phase requirement and load modulation bandwidth. However, the sub optimal solution generated by the IT can still provide a wideband load modulation bandwidth with acceptable back-off efficiency. Meanwhile, it should be noted that back-off efficiency may be sacrificed due to an impedance shift from the optimal $Z_{carrier}$.

Figure 7A:
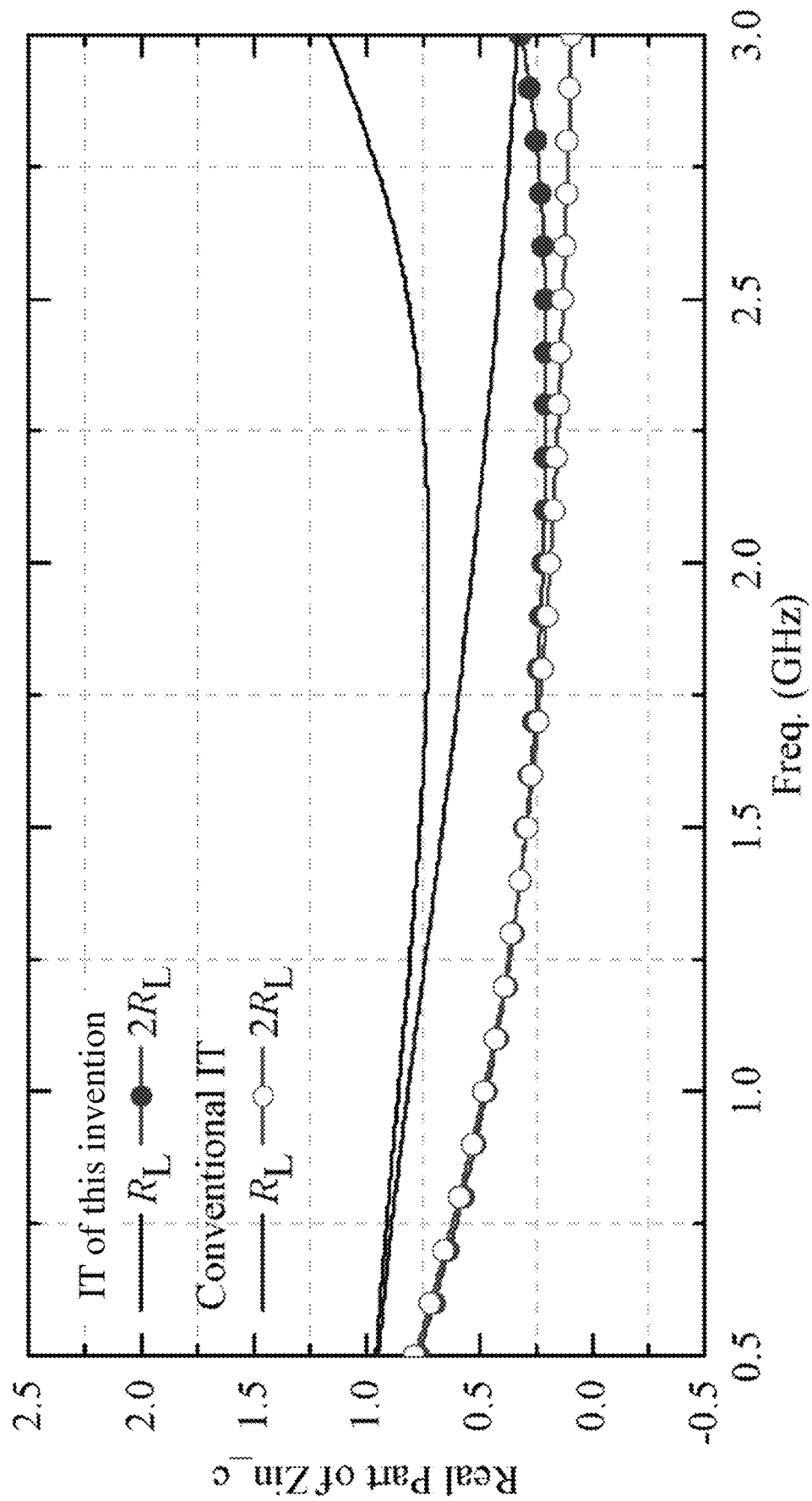
FIG. 7A is plot showing real parts of $Z_{carrier}$ of the IT of the present invention and conventional microstrip IT under different load conditions versus frequency.
Figure 7B:
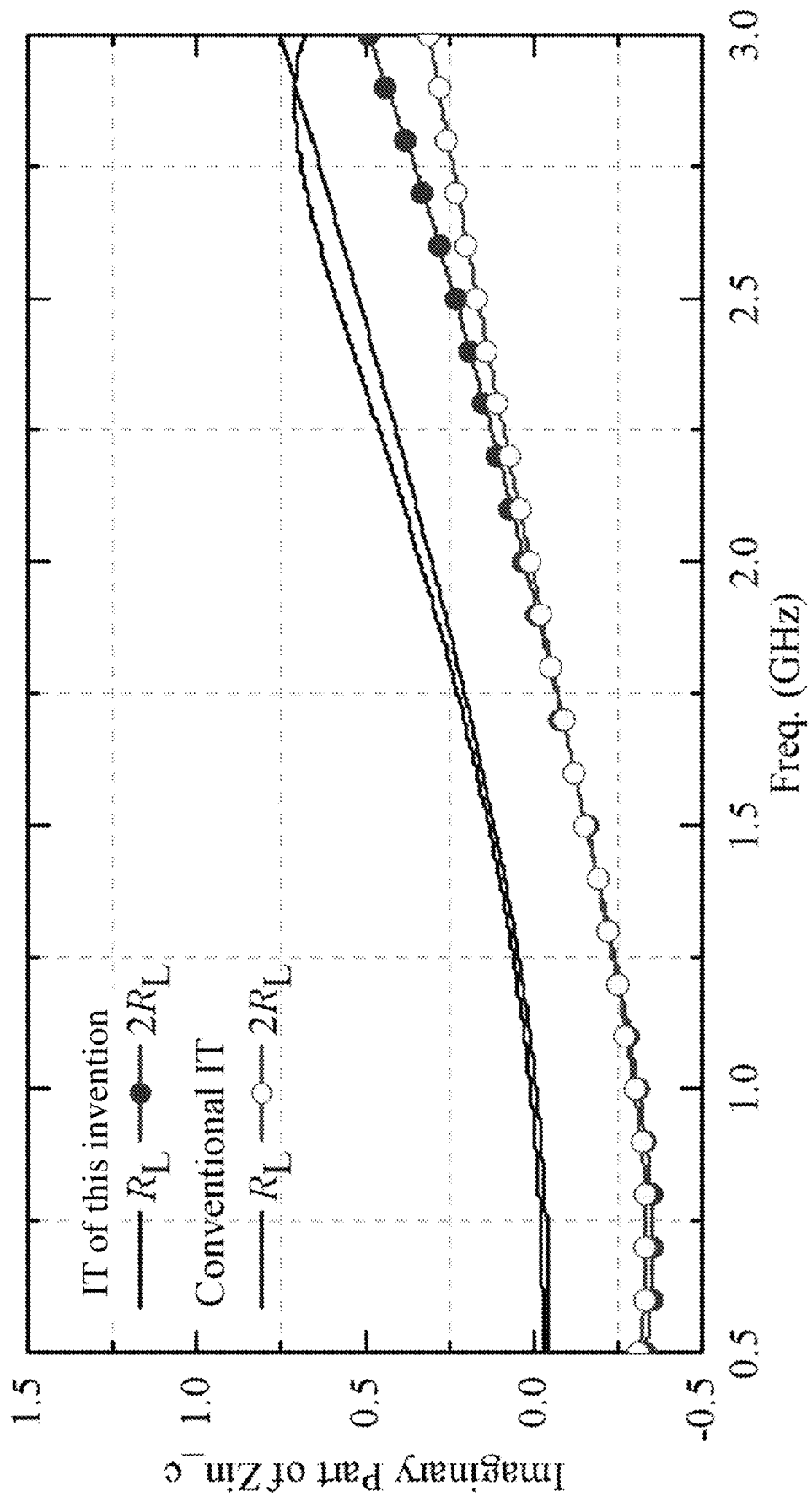
FIG. 7B is a plot showing imaginary parts of $Z_{carrier}$ of the IT of the present invention and conventional microstrip IT under different load conditions versus frequency.

The simulated real part and imaginary part of the IT and the conventional L-type IT (1.6 nH and 3.3 pF) are shown in FIGS. 7A and 7B for a comparison of the bandwidth characteristics. Under load condition $R_L$, the real part of the IT, as shown in FIG. 7A, decreases from 0.96 to 0.73, then increases to 1.17. Its impedance variation is smaller than the conventional IT, which ranges from 0.94-0.29. For the load condition of $2R_L$, the impedance variation of the IT is still better than the conventional IT.

While for the imaginary part, referring to FIG. 7B, under the load condition of $R_L$ and $2R_L$, the impedance variation of the IT is similar to that of the conventional IT (but the impedance variation of the DPA is still better than for the conventional DPA). Advantageously, this verifies that the IT improves the real part impedance variation but not at the expense of load modulation at the imaginary part.

While for the peaking IT, its left-handed network is only in parallel with inductor $L_0$ (shown in FIG. 2). The grounded capacitor ($C_0$) can be considered in cascade with a tuning line. From (2), the peaking IT only needs to satisfy one impedance transformation with a minimum phase at saturation. In other words, it is not necessary to relate $C_0$ with $L_0$ to satisfy the two load conditions like carrier IT design. Preferably, the inductor $L_0$ and the capacitor $C_0$ may minimize a phase dispersion of the right-handed network only in a single load condition at saturation where both the carrier device and the peaking device are conducting.

After the carrier and peaking IT design, two phase tuning lines 112, 114, such as an inductor, may be added to the output of the carrier and peaking branch. This is to compensate for the 90° phase difference between the carrier and peaking device at the current plane. To avoid additional power loss, the characteristic impedance of the two phase tuning lines (tuning line 112 and tuning line 114) should be equal to $R_{carrier}$ and $R_{peaking1}$ at saturation, respectively. The IT and the tuning lines define a load modulation network, and the output at the junction of the tuning lines may be further connected to a post matching network 116 for outputting the amplified signal.

Design procedures for the output side (including the impedance transformer, and post matching network) are given as a guideline for Doherty-like PA fabrication. The circuit is designed using Rogers 4003C substrate ($\varepsilon_r$=3.38, h=0.813 mm).

In step 1, the Doherty-like PA, the operating frequency range is set from 1.25 GHz to 2.30 GHz, which corresponds to a 60% operating bandwidth. The load-pull simulator in Keysight ADS simulation software may be used to obtain the optimal drain impedances for high efficiency at back-off and saturation within the operating frequency band. The simulation results will also help to prove the drain impedance variation tendency.

Figure 9:
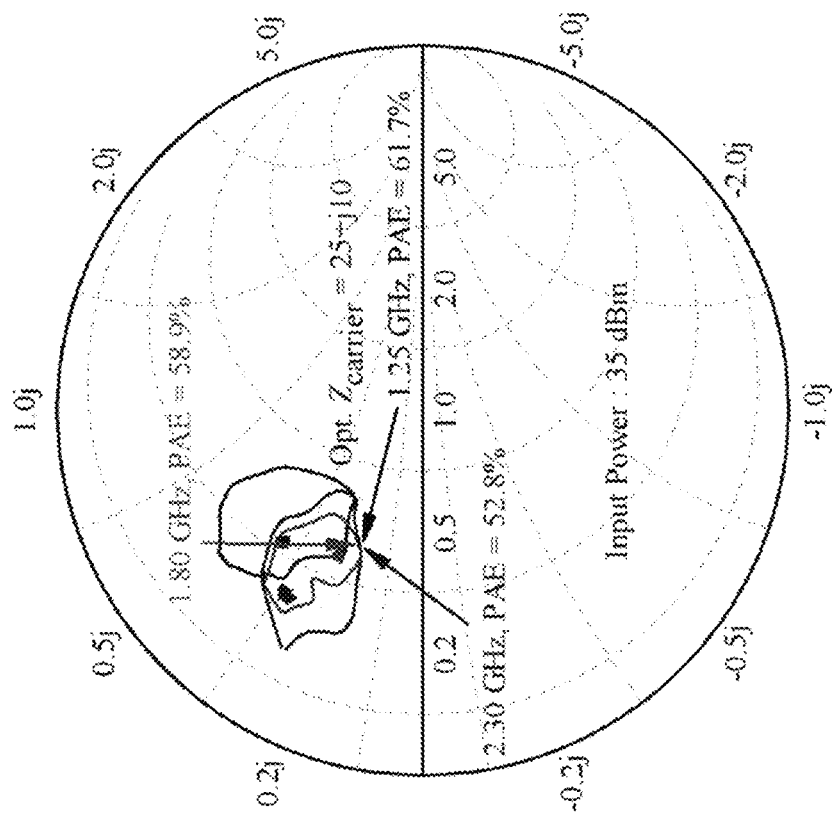
FIG. 9 shows simulated optimal $Z_{carrier}$ at saturation from load-pull simulator ($f_{low}$=1.25 GHz, $f_0$=1.80 GHz, $f_{low}$=2.30 GHz).
Figure 8:
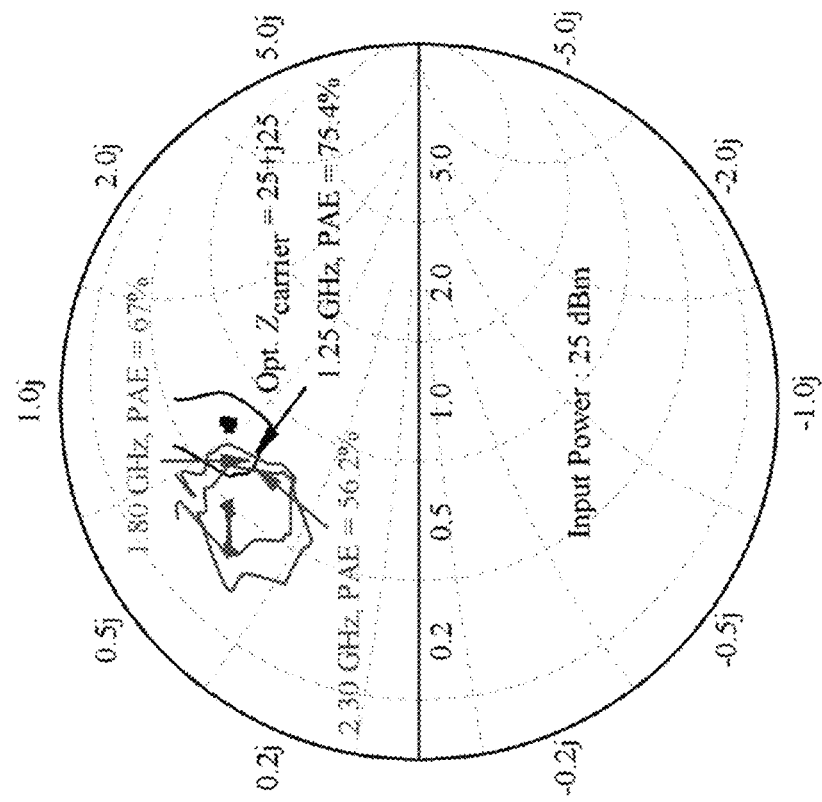
FIG. 8 shows simulated optimal $Z_{carrier}$ at back-off from load-pull simulator within the entire operating frequency range.

For the carrier device (biased at Class-AB), the optimal drain impedance at back-off and saturation can be found in FIG. 8 and FIG. 9. The input power is set to 25 dBm at the back-off point and 35 dBm at saturation. At the back-off point, the optimal $Z_{carrier}$ at 1.25 GHz, 1.80 GHz, and 2.30 GHz are 25+j38.5 Ohm (drain efficiency>75.4%), 18+j27.5

Ohm (drain efficiency>67%), and 12+j23.5 Ohm (drain efficiency>56.2%), respectively. After trade-off between efficiency and frequency range, the impedance of 25+j25 ohm is selected as the target impedance.

While at saturation, the optimal $Z_{carrier}$ at 1.25 GHz, 1.80 GHz, and 2.30 GHz is 18+j19.5 Ohm (efficiency>61.7%), 19.5+j11.5 Ohm (efficiency>58.9%), and 12.5+j16 Ohm (efficiency>52.8%), respectively. The impedance of 25+j10 ohm is selected as the target impedance. This also verifies the optimal $Z_{carrier}$ impedance variation change.

It should be noted that the saturated efficiency is even lower than the back-off efficiency. This is because the input power of 35 dBm is overly large, which results in the carrier power amplifier being over-driven.

Figure 10:
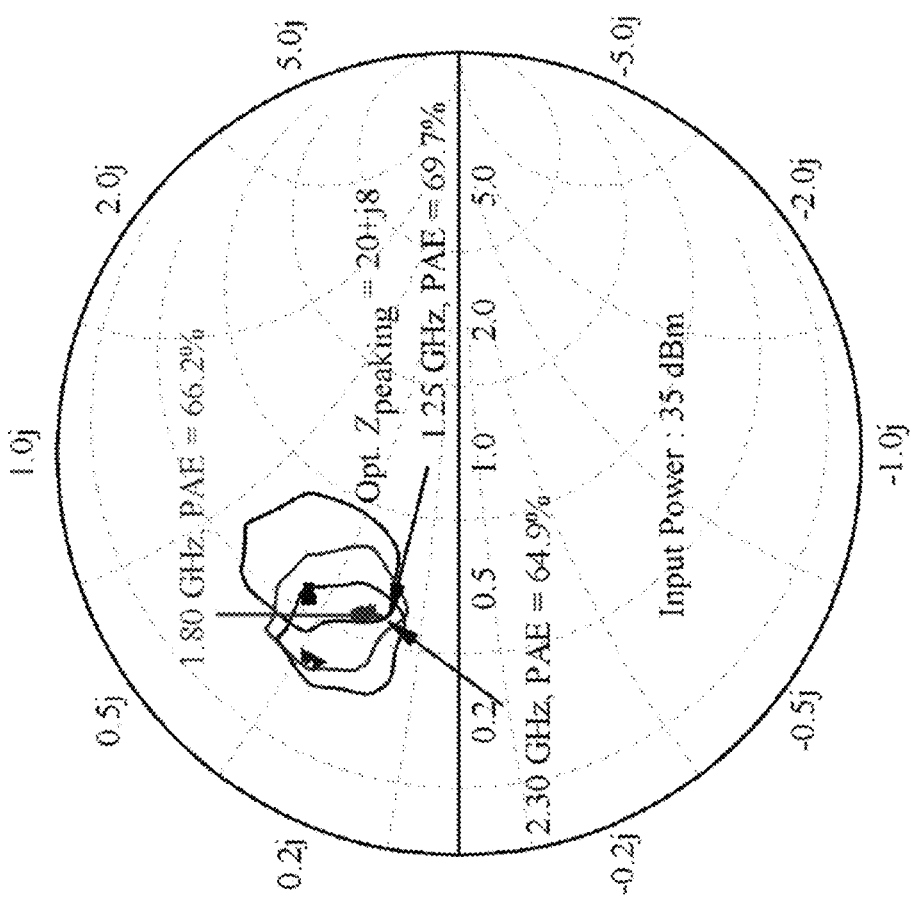
FIG. 10 shows simulated optimal $Z_{peaking}$ at saturation from load-pull simulator within the entire operating frequency range.

For the peaking device (biased at Class-C), the optimal $Z_{peaking}$ at saturation can be found in FIG. 10, which is selected to be 20+j8 Ohm. With such kind of $Z_{peaking}$ the drain efficiency of the peaking device can achieve 69.7% @ 1.25 GHz, 66.2% @ 1.80 GHz, and 64.9% @ 2.30 GHz.

In step 2, firstly, the value of $R_L$ should be identified. Due to the load modulation bandwidth relying mainly on impedance transformation ratio between $R_L$ and $Z_{carrier}$, $R_L$ is suggested to be set equal to the real part of the optimal $Z_{carrier}$ for low impedance transformation ratio. In the Doherty-like PA of the present invention, $R_L$ may be set to 25 Ohm, which is the same as the real part of optimal $Z_{carrier}$ obtained from FIG. 8.

In this example embodiment, all of the left-handed network components ($C_{1c}$, $C_{2c}$, $L_{1c}$) value for carrier IT are set to 1 pF, 1 pF, and 1 nH, respectively. The value of $L_{0c}$ should be set initially to satisfy the requirement of 90° for carrier branch, such as 2.0 nH. For example, this can be achieved by tuning the electrical length of L-type right-handed network. $C_{0c}$ is then calculated to be 1.7 pF based on (22). It should be noted that the value of $C_{0c}$ is also related to the phase dispersion of the IT, which should be carefully designed for minimal phase dispersion.

Figure 11:
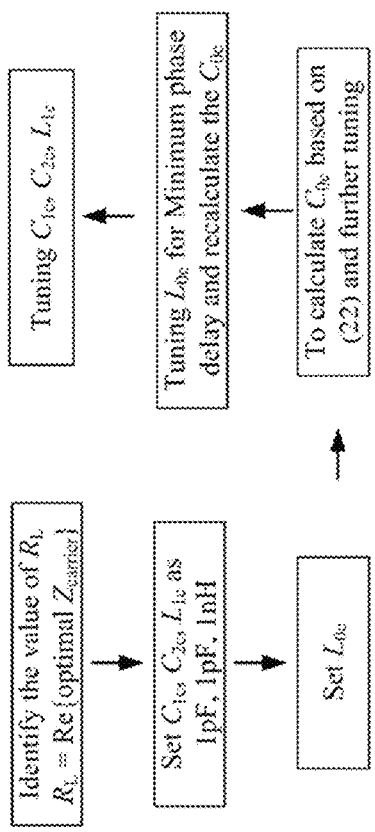
FIG. 11 is a flow chart of the entire carrier IT design procedure in accordance with an embodiment of the present invention.

Inevitably, the parasitic network of the transistor leads to the component value deviating from the theoretical value. Hence, further tuning and iterations are required. After several tuning and iterations, the carrier IT can then be obtained. The flow chart of the entire carrier IT design procedure can be found in FIG. 11.

In step 3, only one load condition of $2R_L$ at saturation should be achieved by the peaking IT. For example, the initial value of $C_{1p}$, $C_{2p}$, $L_{1p}$ may be set to 1 pF, 1 pF, and 1 nH respectively, which is the same as the carrier IT design. Then, $L_{0p}$ and $C_{0p}$ is found to achieve the impedance transformation from $2R_L$ (obtained from Step 2) to optimal $Z_{peaking}$ (obtained from Step 1). It should be noted that the offset line between $L_{0p}$ and $C_{0p}$ can tune the electrical length of the peaking IT, which helps to satisfy the 90° IT phase requirement.

In step 4, for conventional post-matching DPAs, there is an offset line used to connect the carrier and peaking branch. Ideally, $R_{carrier}=R_{peaking}=2R_L$ and the characteristic impedance of the offset line should also be $2R_L$ to prevent power loss. However, in practice, $R_{carrier}$ is not exactly the same as $R_{peaking}$. Consequently, the offset line may result in imperfect power combining. To solve this problem, the Doherty-like PA in accordance of the embodiments of the present invention employs two phase tuning lines (phase tuning line 1 and phase tuning line 2) to connect the carrier and peaking branch.

Preferably, for phase tuning line 1, i.e. the inductor in the carrier branch being connected the first impedance transformer circuit, its characteristic impedance should equal to $R_{carrier}$ at saturation and the electrical length should be tuned to satisfying the quarter-wavelength requirement of carrier branch.

For phase tuning line 2, i.e. the inductor in the peaking branch being connected the second impedance transformer circuit, its characteristic impedance should equal to $R_{peaking}$ at saturation and the electrical length should be tuned to compensate for the phase difference between the two active devices.

Figure 12:
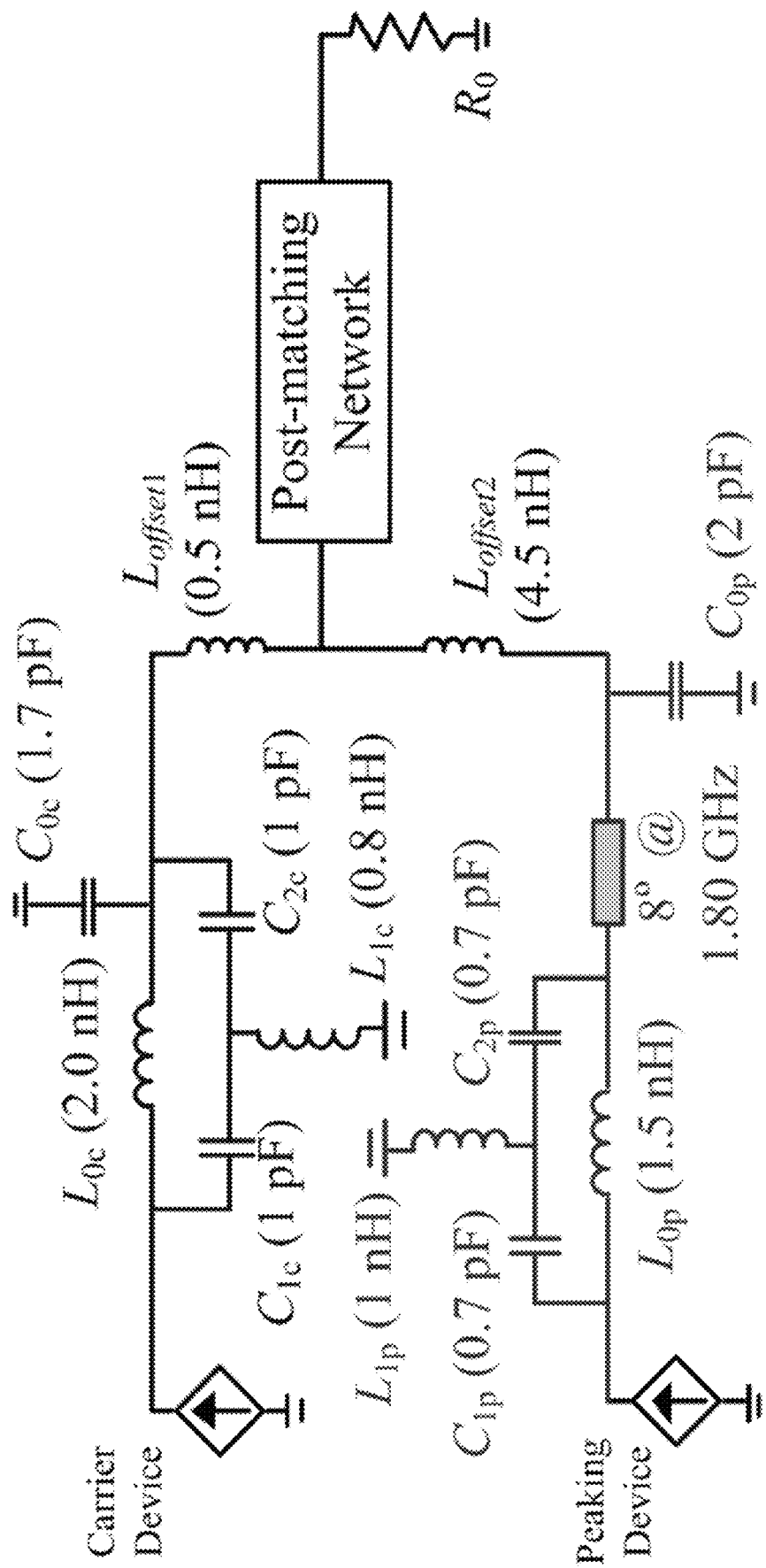
FIG. 12 is a schematic diagram showing an equivalent circuit of load modulation network in the Doherty-like PA in accordance with an embodiment of the present invention.

With reference to FIG. 12, example parameters of the load modulation network formed by the carrier branch—two phase tuning line—peaking branch is shown in the equivalent circuit. In this example embodiment, the carrier and peaking ITs can each be viewed as an equivalent circuit ($L_{0c}$=2.0 nH, $C_{0c}$=1.7 pF, $C_{1c}$=1.0 pF, $C_{2c}$=1.0 pF, $L_{1c}$=0.8 nH, and $L_{0p}$=1.5 nH, $C_{0p}$=2 pF, $C_{1p}$=0.7 pF, $C_{2p}$=0.7 pF, $L_{1p}$=1.0 nH). These are then connected to two tuning lines that are comprised of two inductors ($L_{offset1}$=4.5 nH and $L_{offset2}$=0.5 nH). After the C.N., the PMN realizes a real-to-real impedance transformation.

Figure 13B:
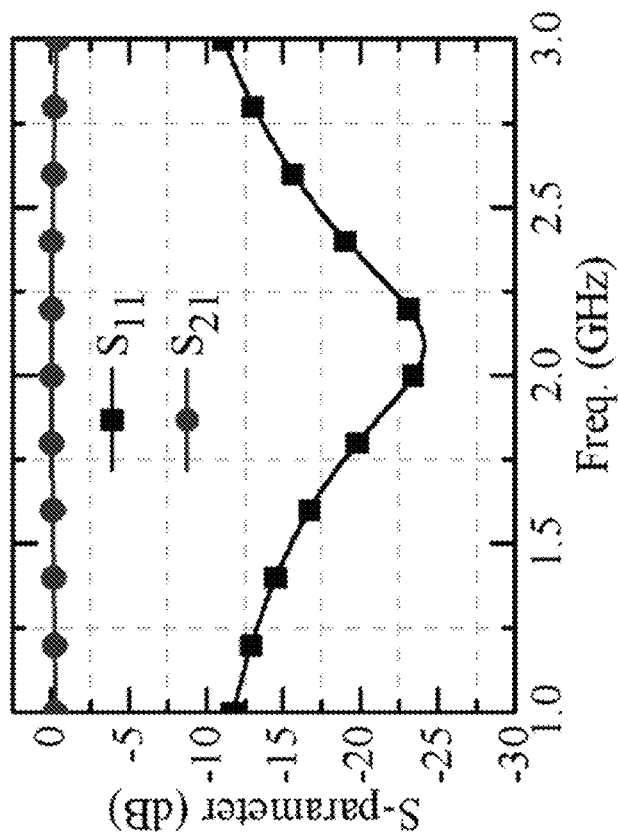
FIG. 13B is a plot showing a frequency response of the post-matching network of FIG. 13A.
Figure 13A:
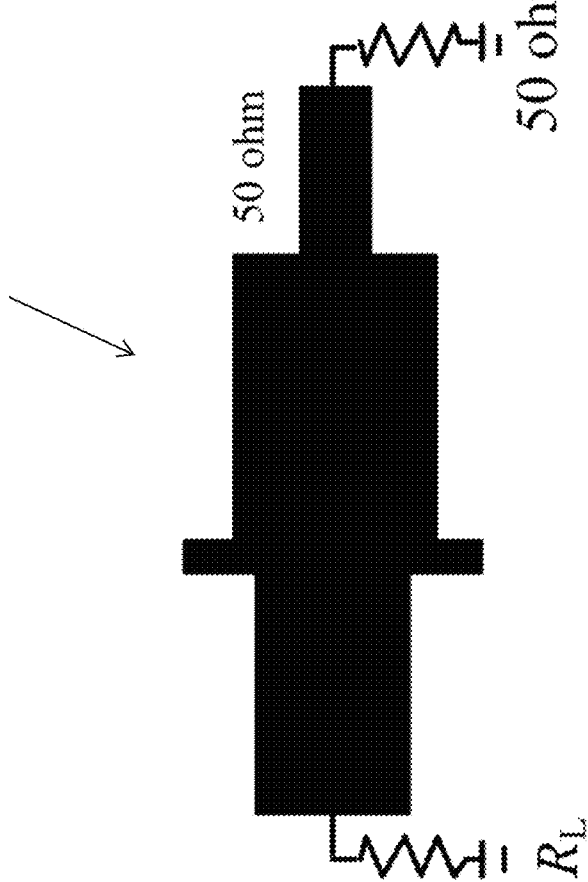
FIG. 13A shows a topology of the post-matching network in accordance with an embodiment of the present invention

Once the entire load modulation network is finished, a "real-to-real" impedance transformation post-matching network 116 may be connected between the combining and system load. Preferably, the PMN 116 has a stepped impedance topology and $R_L$ is 25 Ohm according to the simulated result in step 2. Its topology and frequency response are shown in FIGS. 13A and 13B.

The inventors carried out experiments for evaluating the performances of the DPA 100.

Figure 14:
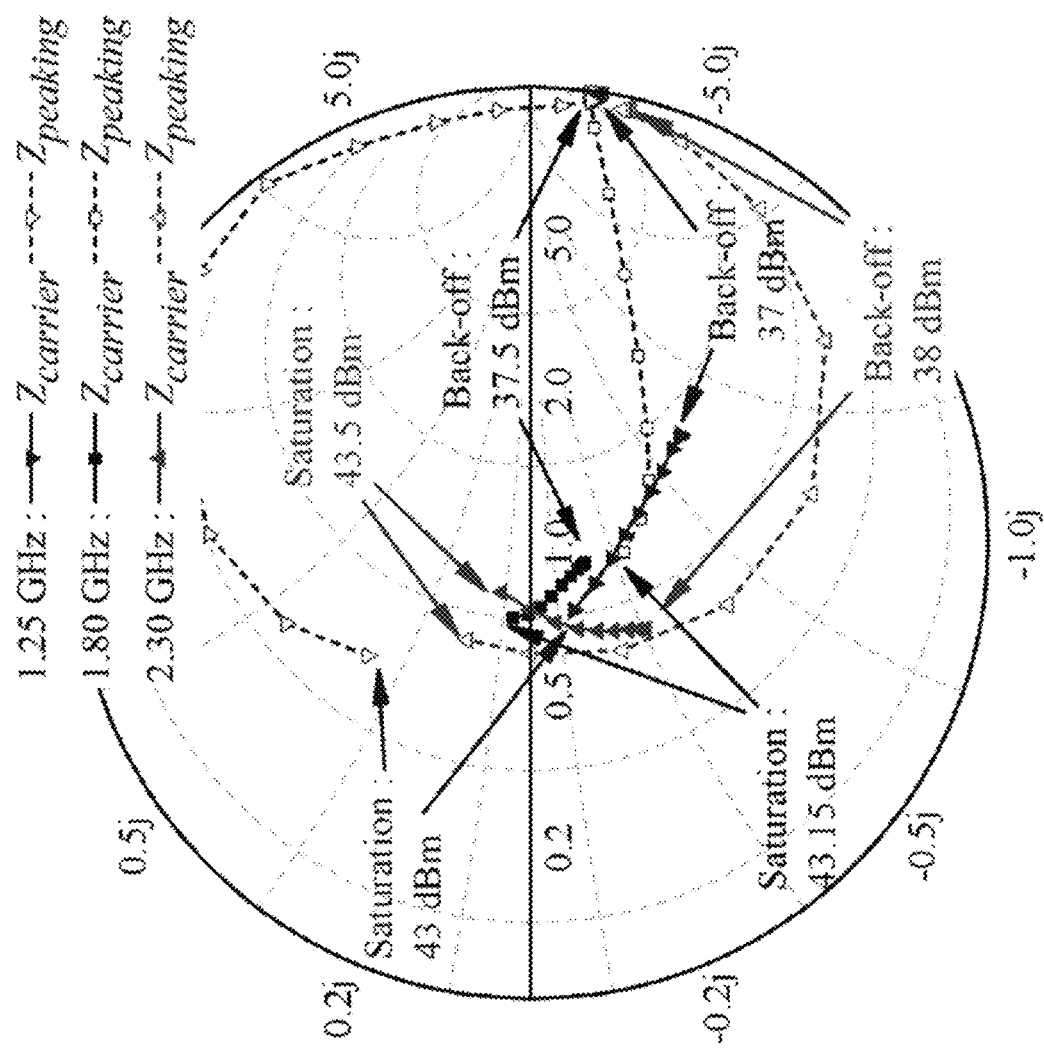
FIG. 14 shows simulated intrinsic $Z_{carrier}$, $Z_{peaking}$ within entire operating frequency with increase of input power.

Referring to FIG. 14, simulated intrinsic $Z_{carrier}$, $Z_{peaking}$ at $f_{low}$=1.25 GHz, $f_0$=1.75 GHz, and $f_{high}$=2.30 GHz are illustrated. As predicted, the $Z_{carrier}$ moves towards the real axis with increase in output power while $Z_{peaking}$ is modulated from "infinite" impedance to their optimal drain impedances.

Figure 15:
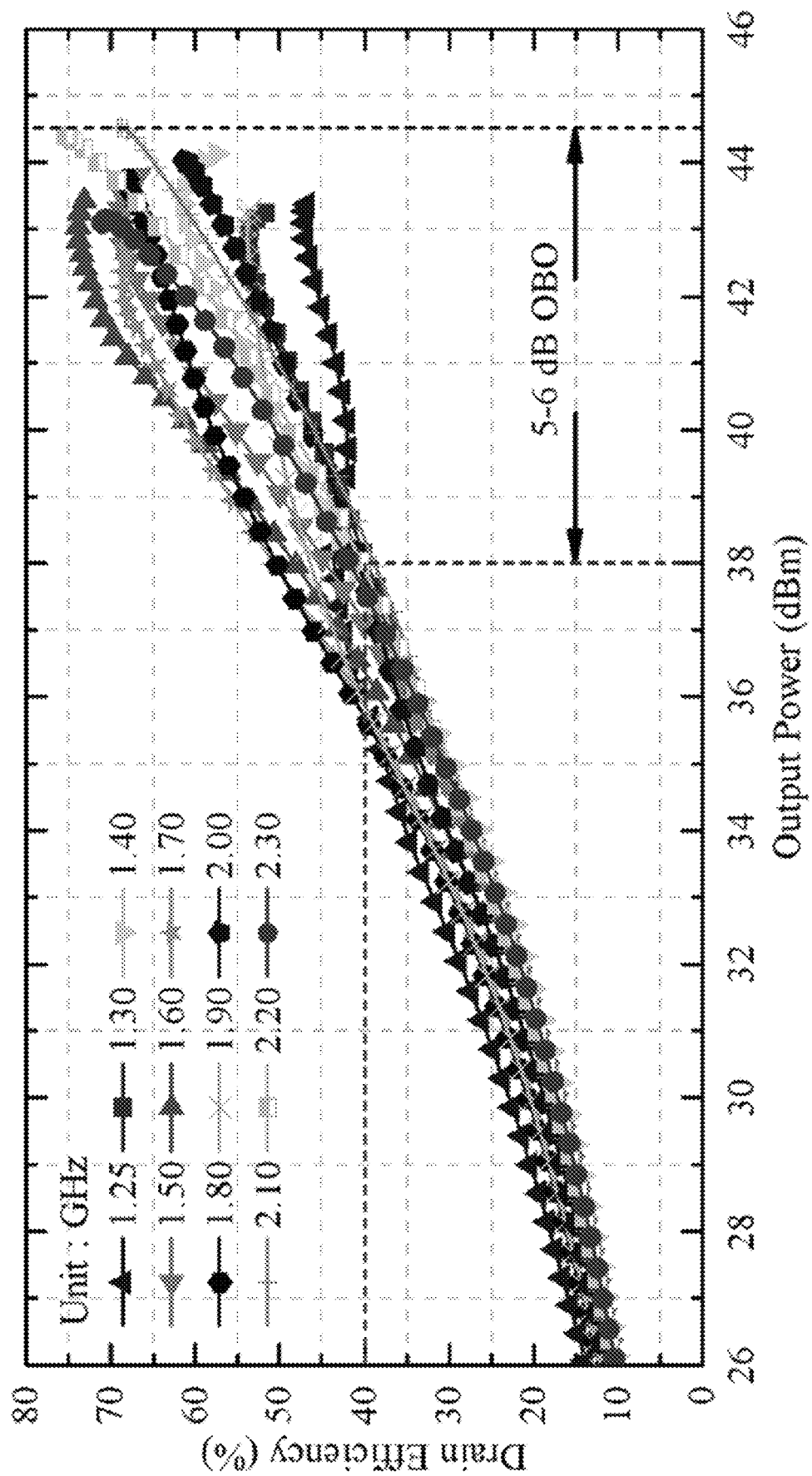
FIG. 15 is a plot showing simulated drain efficiency versus output power under continuous wave (CW) excitation.

Referring to FIG. 15, the simulated drain efficiency of the Doherty-like PA versus output power over the entire operating frequency range is illustrated. For the Doherty-like PA, Doherty behaviors can be observed from 1.25 GHz to 2.30 GHz. Over this same frequency band, the drain efficiencies are 40%-50% for 5-6 dB back-off from saturation and 55%-78% for saturation, respectively.

Figure 16:
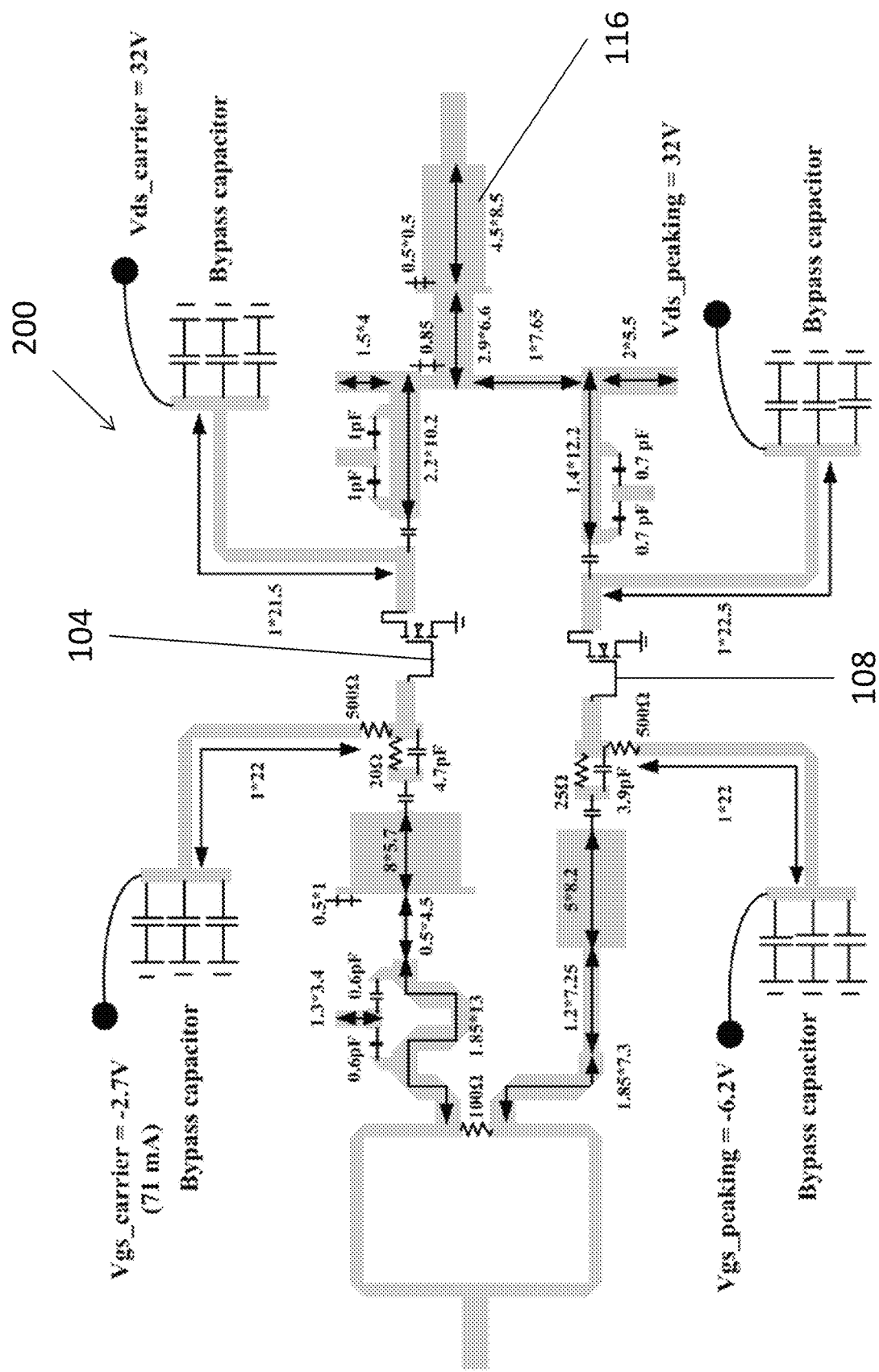
FIG. 16 is a schematic diagram of the DPA in accordance with an embodiment of the present invention.
Figure 17:
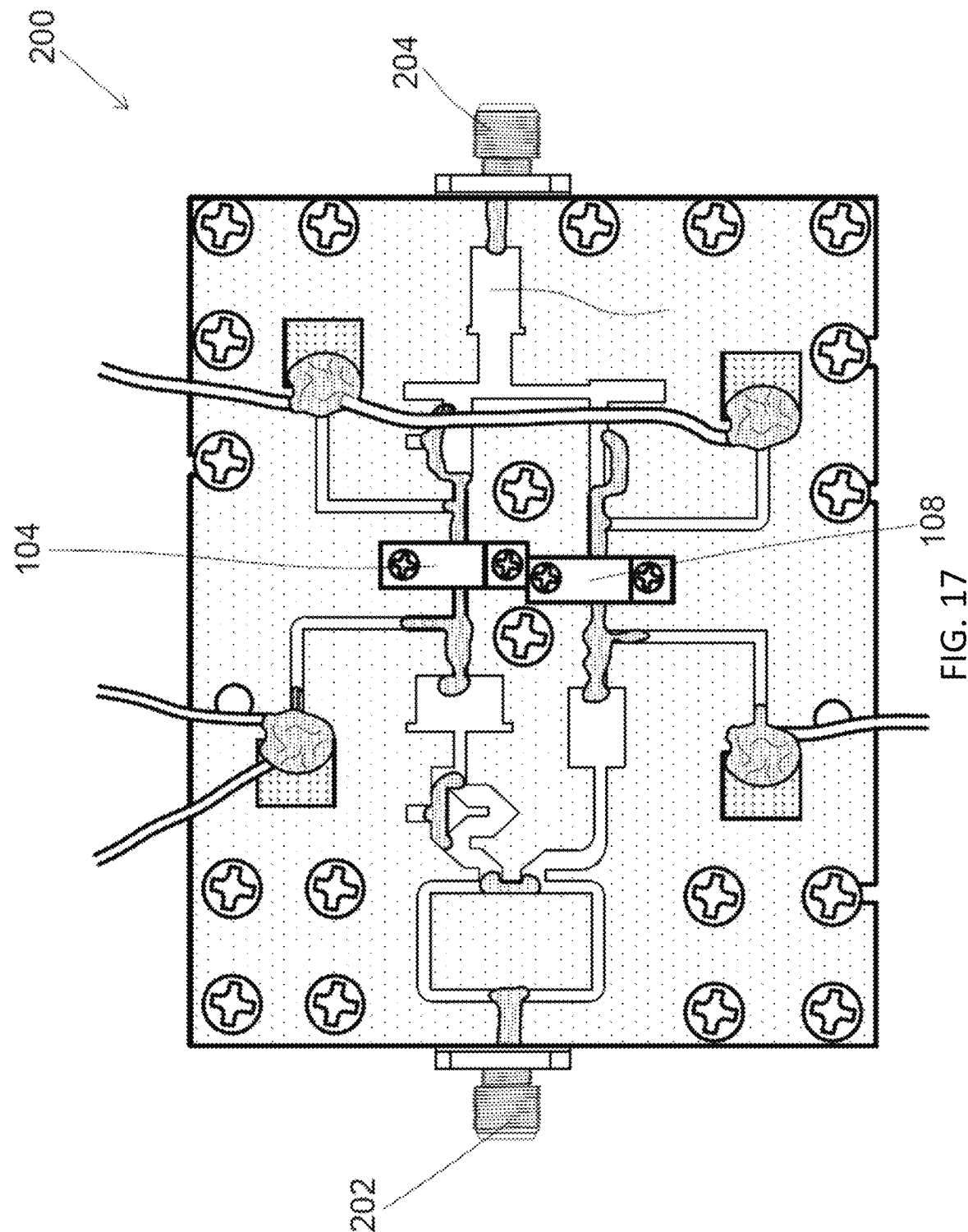
FIG. 17 is a photographic image showing a fabricated Doherty-like PA of FIG. 16.

With reference to FIG. 16, the detailed dimensions of an example embodiment of Doherty-like PA 200 are shown, and the Doherty-like PA 200 is fabricated using these design parameters, as shown in FIG. 17. In this example, the DPA further comprises an input connector 202 arranged to provide input signals fed to both the carrier device and the peaking device, and an output connector 204 arranged to output signals from the post matching network.

An example Doherty-like PA 200 using paralleled right- and left-handed IT is implemented and evaluated. The carrier ($I_{DQ}$=71 mA, biased at −2.8 V) and peaking (biased at −6.2 V) devices use the same 10-W GaN HEMT CGH40010F from Cree Inc. Tuning of the peaking device gate bias is a good method to obtain a more distinct Doherty characteristic for the Doherty-like PA 200.

Figure 18:
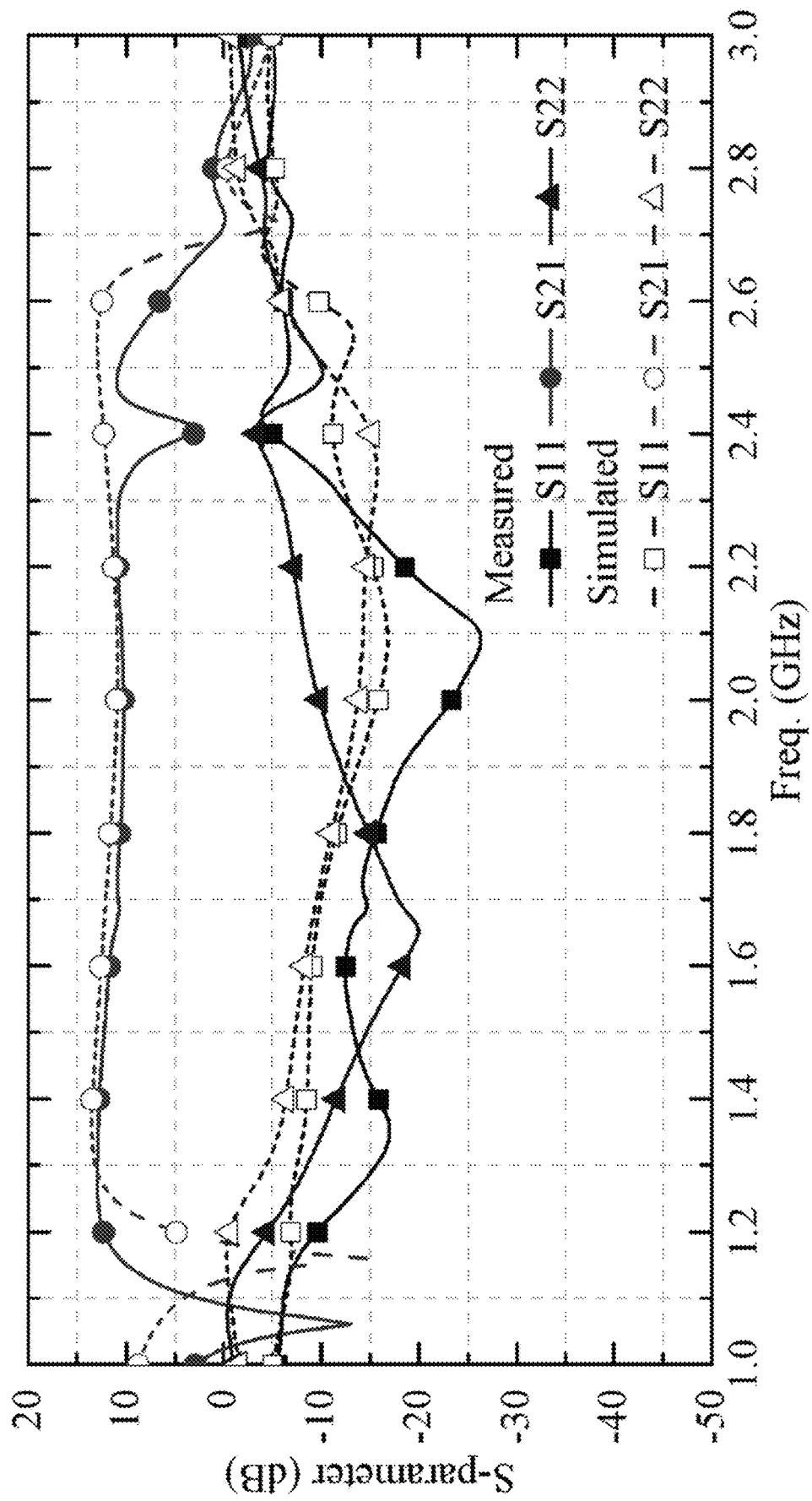
FIG. 18 is a plot showing simulated and measured S-parameter performance of the Doherty-like PA of FIG. 17.

However, there may be a trade-off with efficiency and linearity. In the Doherty-like PA 200, the gate bias of the peaking device is selected to strike a good balance between efficiency and linearity at back-off at the expense of a more distinct Doherty type characteristic. The simulated small signal S-parameter and measured small signal S-parameter can be found, which is shown in FIG. 18.

Referring to the plot, it may be observed that a dip in $S_{21}$ can be seen at 2.4 GHz, between measurements and simulation, and is caused by a frequency shift of Doherty-like PA design. There are two transmission zeros (TZs) in the pass band. For the lower frequency TZ, the simulated TZ is located at 1.18 GHz and the measured TZ is located 1.05 GHz. The lower frequency TZ is shifted by 12.3% (1.18/1.05−1). For the upper frequency TZ, the simulated TZ is located at 2.7 GHz and the measured TZ is located 2.4 GHz. The upper frequency TZ is shifted by 12.5% (2.7/2.35−1), which is very similar to the lower frequency TZ frequency percentage shift. This verifies that the dip is $S_{21}$ is caused by the frequency shift.

Figure 19:
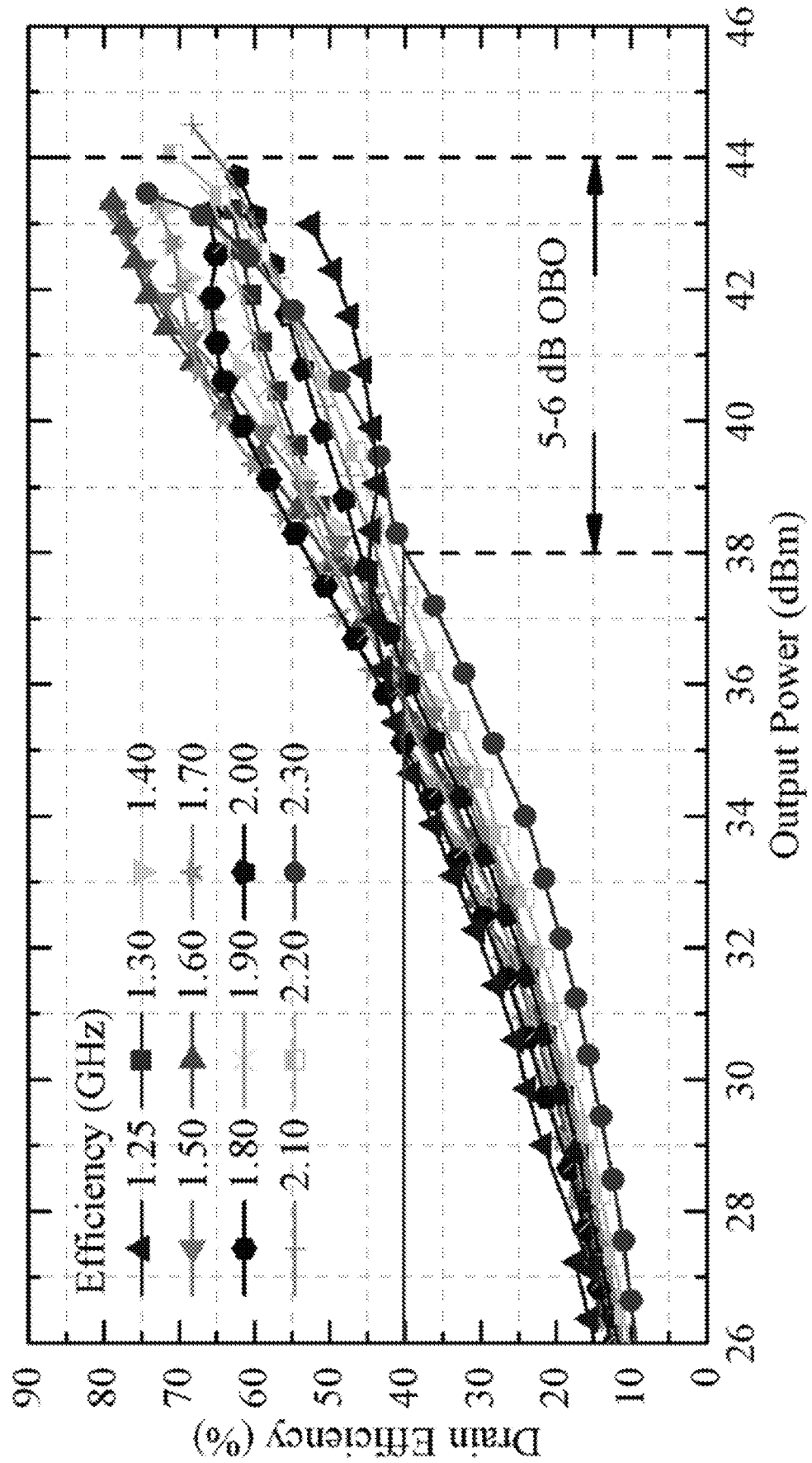
FIG. 19 is a plot showing drain efficiency versus output power within entire operating frequency of the Doherty-like PA of FIG. 17.

With reference to FIG. 19, there is shown measured drain efficiencies (DE) versus output power level over the entire operating frequency range. In this measurement, Doherty behaviors can be observed from 1.25 GHz to 2.30 GHz, which corresponds to a bandwidth of 59.1%. Over this same frequency band, the drain efficiencies are 40%-52% for 5-6 dB OBO from saturation and 52%-80% for saturation, respectively. This allows the power amplifier 200 of the present invention to operate with a wide bandwidth of 60%, which may be useful in the 4G and 5G applications. However, it is observed that the back-off efficiency at 2.3 GHz is a little bit lower than the ones at other frequencies but it is still acceptable.

Figure 22:
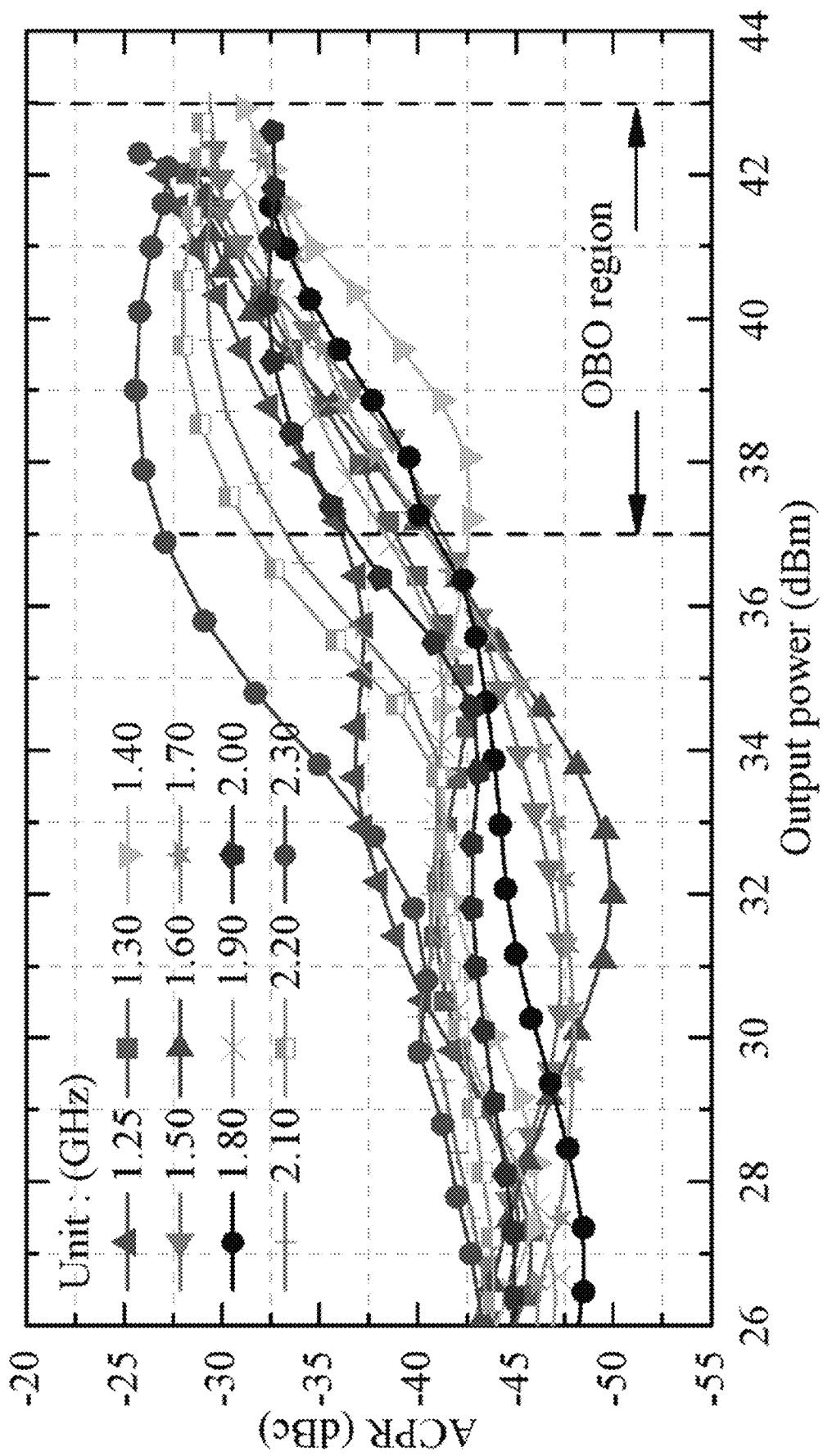
FIG. 22 is a plot showing measured ACPR (lower) versus output power within entire operating frequency of the Doherty-like PA of FIG. 17.

This is because the load modulation is relatively weaker at the band edge. It should be noted that the Doherty efficiency behavior of the DPA 200 is not clearly obvious. This is the more distinct Doherty characteristic is sacrificed.

only one of them is shown plotted in FIG. 22. The lower ACPR performance of the Doherty-like PA was better than −27 dBc and −25.5 dBc at 6-dB back-off and saturation from 1.25 to 2.30 GHz.

Figure 23:
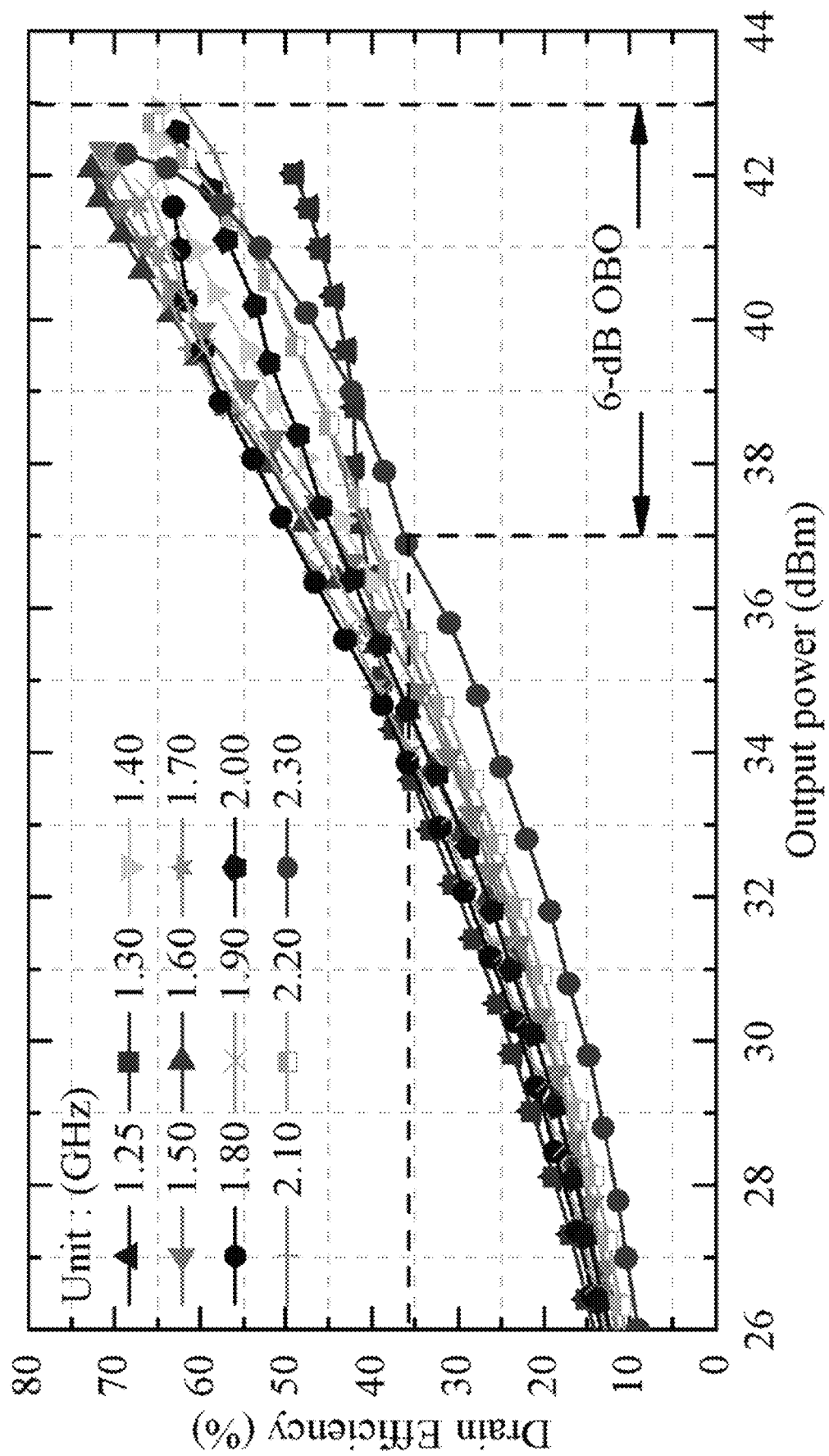
FIG. 23 is a plot showing measured drain efficiency versus output power under modulated signals excitation of the Doherty-like PA of FIG. 17.

Measured drain efficiencies using modulated signals with respect to output power are shown in FIG. 23. It can be observed that the average drain efficiency at 37 dBm, i.e. 6 dB back-off point of modulated signal measurement, is better than 36%, which is slightly lower than the results obtained with CW excitation. Average drain efficiency at saturation is better than 49%. In general, it is observable that the power amplifier of the present invention has at least 40% drain efficiency at 6-dB back-off point.

Figure 24:
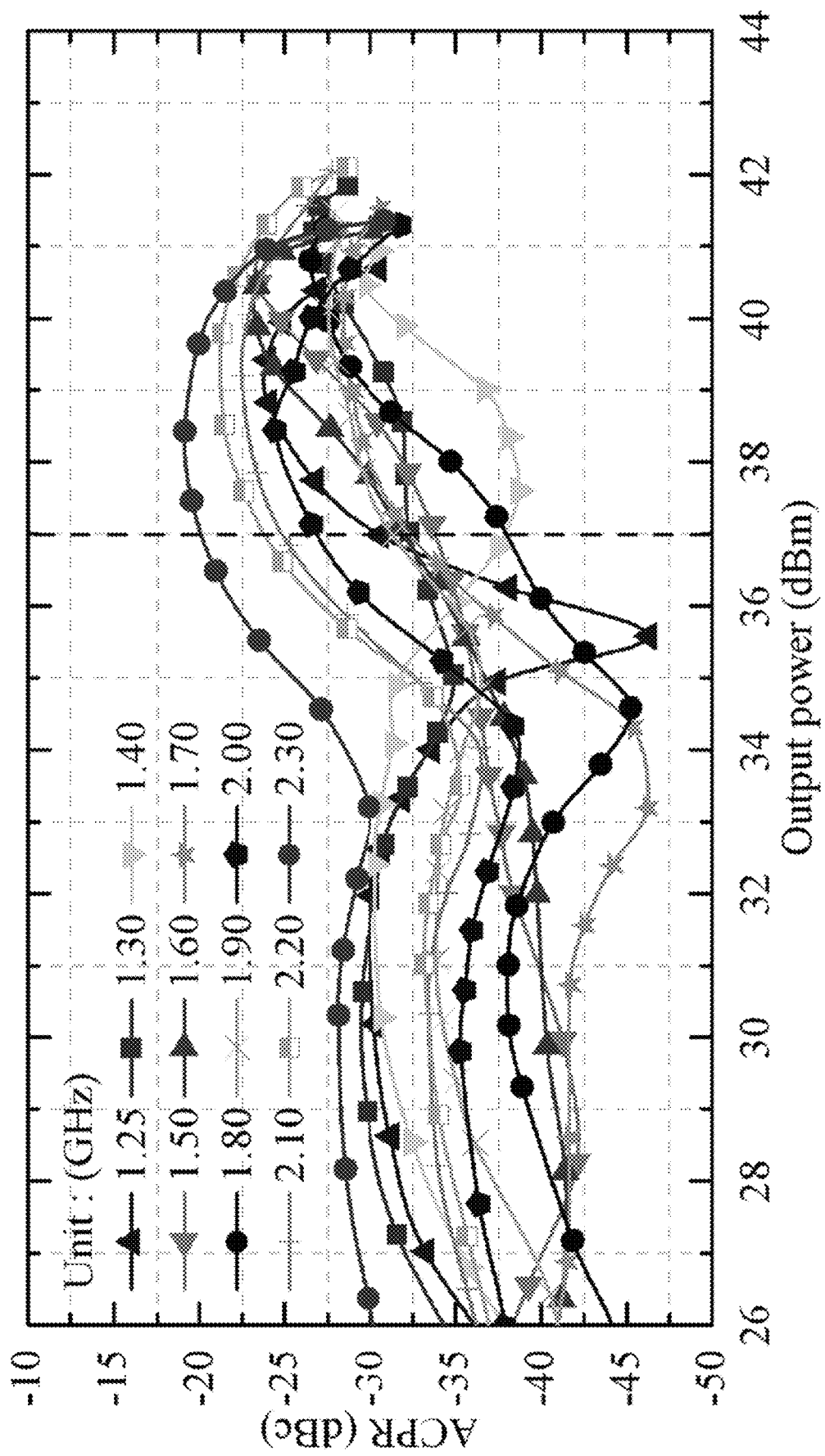
FIG. 24 is a plot showing measured IMD3 (upper) versus output power within entire operating frequency of the Doherty-like PA of FIG. 17.
Figure 25:
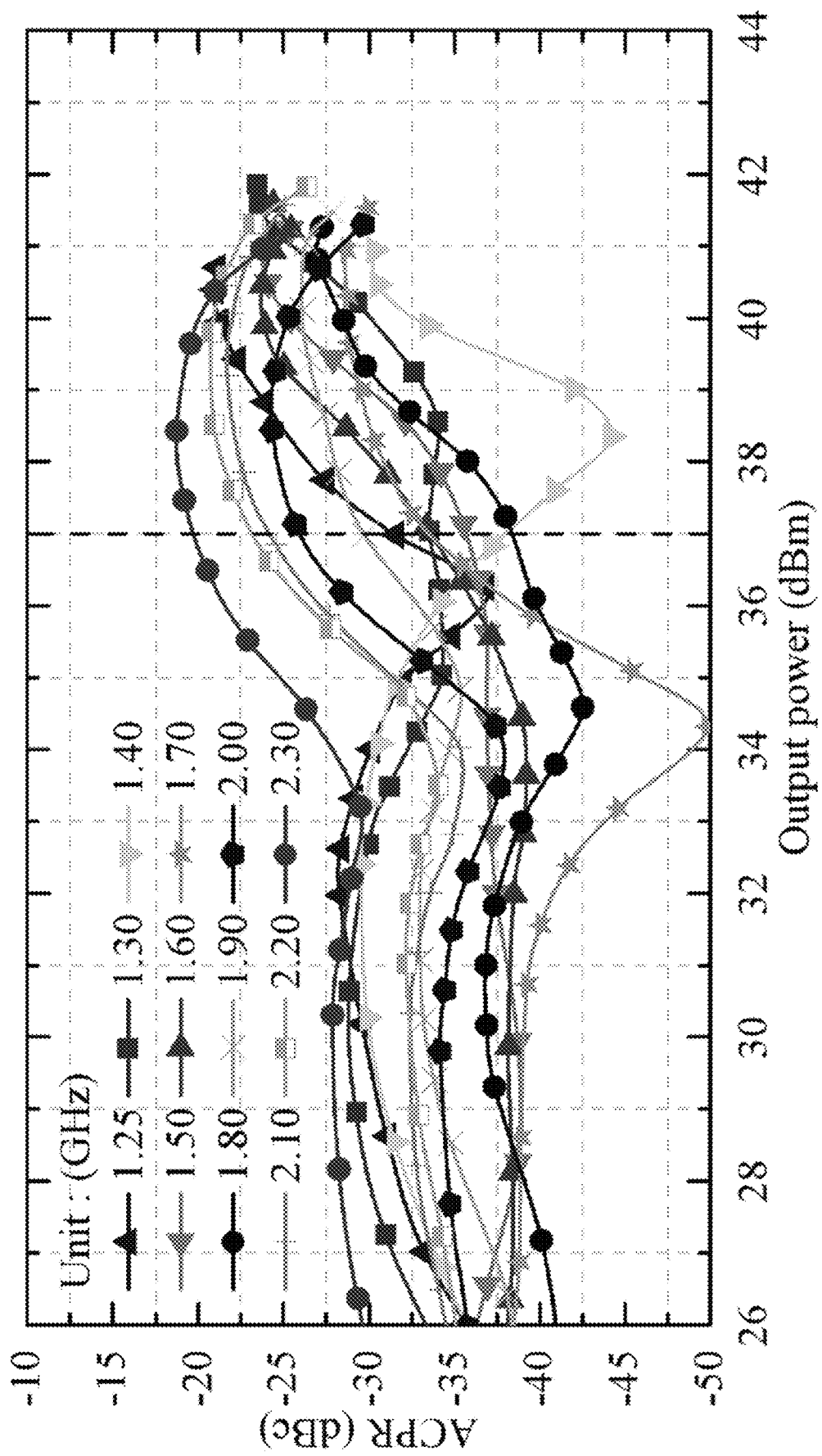
FIG. 25 is a plot showing measured IMD3 (lower) versus output power within entire operating frequency of the Doherty-like PA of FIG. 17.

In addition, to test the linearity of the Doherty-like PA 200, measurements were performed using two-tone signal with tone spacing of 5-MHz, which are shown in FIG. 24 and FIG. 25. The upper IMD3 performance of the Doherty-like PA ranges from −37.5 dBc to −20 dBc at an output power of 37 dBm within the entire operating frequency bands. The lower IMD3 performance of the Doherty-like PA ranges from −38 dBc to −19 dBc at an output power of 37 dBm within the operating frequency bands.

A comparison between the performance of the Doherty-like PA 200 of the present invention and some other example DPAs is shown in the following table.

| Freq. (GHz) | FBW (%) | Input power divider | DPA Configuration | Saturated Pont (dBm) | PUF* | Continuous Wave Measurement | | BW (MHz) | PAPR (dBc) | Modulated Signal Measurement ACLR @ BO Before DPD (dBc) |
|---|---|---|---|---|---|---|---|---|---|---|
| | | | | | | DE @ BO (Max/Min) | DE @ Sat. (Max/Min) | | | |
| 1.05-2.55 | 83.3 | Lange coupler | 2-Way | 40-42 | 0.63-0.99 | 58/35 | 83/45 | 5 | — | −25/−29 |
| 0.47-0.80 | 52 | Wilkinson | 2-Way | 58.5-59.5 | >1.16 | 45/38 | 56/48 | — | 9.5 | — |
| 1.60-2.20 | 31.6 | 90° Hybrid Coupler | 2-Way | 45.9-47 | 0.9-1.16 | 55/51 | 71/60 | 20 | 9.1 | −26/−30 |
| 1.08-3.80 | 71.4 | Wilkinson power divider | 7-way | 44.3-46.5 | 0.48-0.8 | 51/40 | 62/42 | 20 | 8 | −19/−35 |
| 1.70-2.60 | 42 | Wilkinson | 2-Way | 44.6-46.3 | 0.48-0.71 | 57/47 | 66/57 | 5 | 6.5 | −25/−33.8 |
| 0.55-1.10 | 67 | QHM-4R-4.7G | 2-Way | 42-43.5 | 0.61-0.86 | 52/40 | 72/58 | 20 | 7.1 | −22/−31 |
| 1.5-3.8 | 87 | Wilkinson Power Divider | 7-Way | 42.3-43.4 | 0.65-0.84 | 55/33 | 63/42 | 7 | 9 | −42 @ 2.6 GHz |
| 2.2-4.8 | 74.2 | Wilkinson Power Divider | 2-Way | 39.2-41 | 0.52-0.79 | 49.7/35 | 72/50 | 200 | 7.7 | — |
| 1.6-2.6 | 48 | Anaren X3C22E1-038 | 3-Way | 45.5-46 | 0.91-1.02 | 53/50 | 66/53 | 40 | 9 | −21/−25 |
| 0.72-0.98 | 30 | Anaren X3C09A2-03 | 2-Way | 54-55.5 | 1.04-1.47 | 54.6/46.6 | 69/59 | 20/40 | 7.1/8.8 | −48 after DPD |
| 1.7-2.8 | 49 | Anaren X3C22E31-035 | 2-Way | 44-44.5 | 0.96-1.08 | 55/50 | 71/57 | 20 | 6.5 | Around −30 |
| 1.25-2.30 | 60 | Wilkinson Power Divider | 2-Way | 43-44.5 | 0.77-1.09 | 52/40 | 50/52 | 5 | 6.5 | −27.5/−42.5 @ 1.4 GHz |

Figure 20:
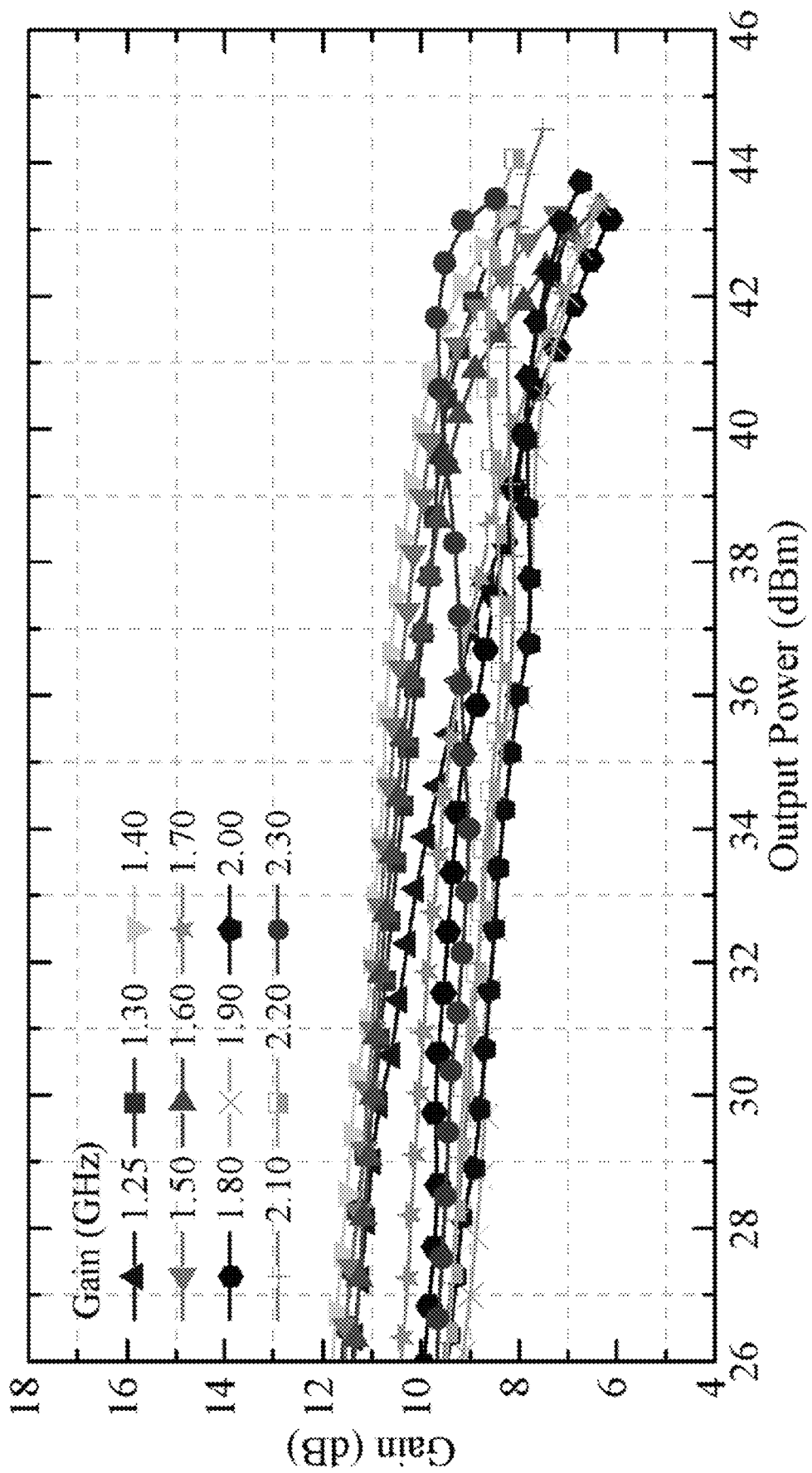
FIG. 20 is a plot showing measured gain versus output power within entire operating frequency of the Doherty-like PA of FIG. 17.
Figure 21:
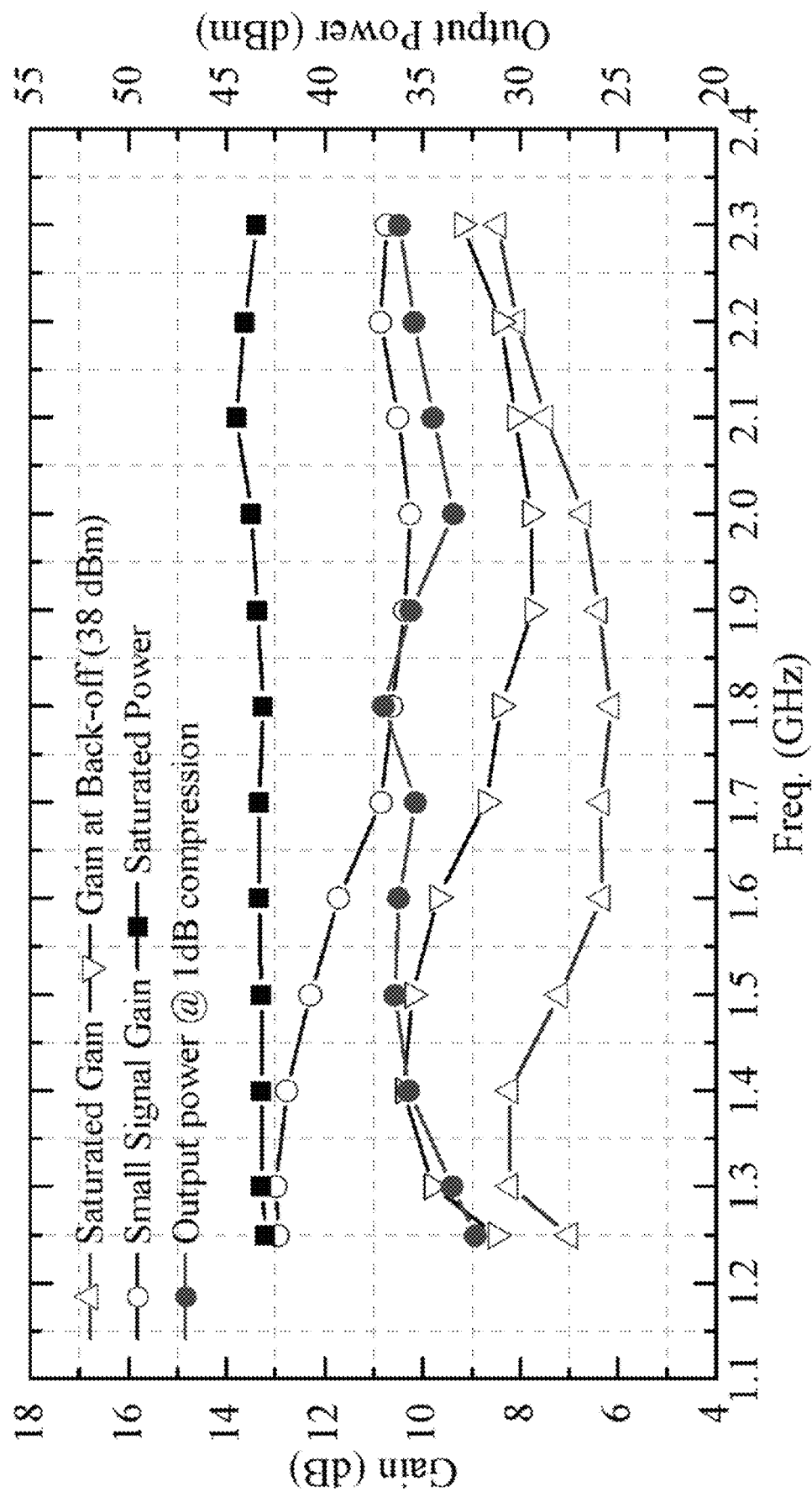
FIG. 21 is a plot showing measured output power and gain versus frequency for the Doherty-like PA of FIG. 17.

With reference to FIG. 20 and FIG. 21, there is shown measured gain of the DPA 200 with respect to output power. For the small signal gain, it varies from 10.2 dB to 12.9 dB over the entire operating frequency band. At the 5-6 dB back-off points (38 dBm) from saturation and saturation, the gain ranges from 10.4 dB to 8 dB and from 8.5 dB to 6.2 dB, respectively. The saturated output power ranges from 43 dBm to 44.5 dBm over the entire operating frequency band, while output power @ the 1 dB compression point ranges from 32.3 dBm to 37 dBm.

To test the linearity of the Doherty-like PA 200 using a modulated signal, measurements were performed using a single carrier WCDMA 3GPP test signal with PAPR of 6.5 dB. As the ACPRs in both upper and lower bands are similar, In this table, P.U.F is defined as (measured saturation power)/(devices' nominal saturated power).

In terms of bandwidth, the DPA 200 of the present invention exhibits a much wider bandwidth compared to other structures, with the exception of those examples with much lower efficiency at back-off and saturation or with more transistors. It should be noted that phase flatness of the input power divider has a great influence on its bandwidth.

In one comparison, the Doherty-like PA 200 of the present invention has a higher PUF and better ACLR @ BO before the DPD. In terms of the efficiency and linearity, the Doherty-like PA also gives a comparable performance.

Although the back-off efficiencies of some of the examples are higher than the Doherty-like PA 200 of the present invention, they do not have as wide a bandwidth. In terms of the output power, the Doherty-like PA 200 has a higher PUF compared to most designs shown in the above table. Advantageously, the Doherty-like PA 200 exhibits superior combined performance, especially in terms of bandwidth and efficiency at the back-off point.

These embodiments may be advantageous in that, the parallel right- and left-handed microstrip ITs may be included in a PA circuit for the carrier and peaking devices, which achieves significant bandwidth extension. For the carrier IT, by parallel implementation of the right-handed and left-handed network, a minimum phase delay and maximum phase flatness for the IT can be achieved, without sacrificing its load modulation capability. For the peaking IT, the minimum phase delay is also achieved, which reduces the insertion loss of the peaking branch. This allows a more complete conduction of the peaking device, which provides higher output power and efficiency.

Advantageously, as shown in the GaN broadband Doherty PA fabricated in accordance with embodiments of the present invention, the PA is operable from 1.25 to 2.30 GHz with a 6-dB back-off. The drain efficiency of %-52% at 6-dB back-off (37 dBm) and the drain efficiency of 52%-80% at saturation can be maintained, respectively.

In addition, the Doherty-like PA also delivers high efficiency and comparable linearity performance when driven by W-CDMA modulated signals. At least 36% efficiency can be obtained at 37 dBm of output power. Furthermore, the Doherty-like PA achieves adjacent channel power ratios (ACPR)−42.5 dBc-−27.5 dBc at 6-dB back-off, and −32.5 dBc-−25 dBc at saturation. The paralleled right- and left-handed IT represents a major step in delivery the power-efficient, wide-band performance required for emerging wireless communication systems.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A power amplifier circuit comprising:
a first impedance transformer circuit arranged to connect with a carrier device; and
a second impedance transformer circuit arranged to connect with a peaking device;
wherein both the first and the second impedance transformer circuit include a parallel impedance transformer arrangement that comprises a left-handed network paralleled with a right-handed network; wherein the left-handed network comprises a $C_1$-$L_1$-$C_2$ LC network; and wherein the $C_1$-$L_1$-$C_2$ LC network is connected to two terminal ends of the right-handed network.

2. The power amplifier circuit in accordance with claim 1, wherein the right-handed network of the first impedance transformer circuit comprises a $L_0$-$C_0$ LC network, wherein $C_0$ is a grounded capacitor.

3. The power amplifier circuit in accordance with claim 2, wherein the inductor $L_0$ and the capacitor $C_0$ are arranged to minimize a phase dispersion of the right-handed network.

4. The power amplifier circuit in accordance with claim 3, wherein an inductance value of $L_0$ and a capacitance value of $C_0$ in the first impedance transformer circuit combine to define a relationship of:

$$C_0 = \frac{2}{L_0} + L_0 + \frac{\sqrt{2}-4}{2}.$$

5. The power amplifier circuit in accordance with claim 1, wherein the right-handed network of the second impedance transformer circuit comprises an inductor $L_0$ connected to a microstrip line followed by a grounded capacitor $C_0$.

6. The power amplifier circuit in accordance with claim 5, wherein the inductor $L_0$ and the capacitor $C_0$ are arranged to minimize a phase dispersion of the right-handed network only in a single load condition at saturation where both the carrier device and the peaking device are conducting.

7. The power amplifier circuit in accordance with claim 1, further comprising a phase tuning line connected to an output of each of the first and the second impedance transformer circuits.

8. The power amplifier circuit in accordance with claim 7, wherein in a carrier branch defined by the first impedance transformer circuit and a first phase tuning line, the first phase tuning line has a characteristic impedance of $R_{carrier}$ at saturation.

9. The power amplifier circuit in accordance with claim 7, wherein in a peaking branch defined by the second impedance transformer circuit and a second phase tuning line, the second phase tuning line has a characteristic impedance of $R_{peaking}$ at saturation.

10. The power amplifier circuit in accordance with claim 7, wherein each of the phase tuning lines includes an inductor.

11. The power amplifier circuit in accordance with claim 1, further comprising a post matching network connected to an output of a load modulation network defined by a combination of the first and the second impedance transformer circuit.

12. The power amplifier circuit in accordance with claim 11, wherein the post matching network has a stepped impedance topology.

13. The power amplifier circuit in accordance with claim 11, further comprising an input connector arranged to provide input signals fed to both the carrier device and the peaking device, and an output connector arranged to output signals from the post matching network.

14. The power amplifier circuit in accordance with claim 1, wherein the first impedance transformer circuit and the second impedance transformer circuit combine to define a Doherty Power Amplifier topology.

15. The power amplifier circuit in accordance with claim 1, wherein the carrier device and the peaking device are transistors.

16. The power amplifier circuit in accordance with claim 1, wherein the power amplifier is arranged to operate with a wide bandwidth of 60%.

17. The power amplifier circuit in accordance with claim 1, wherein the power amplifier has at least 40% drain efficiency at 6-dB back-off point.

18. The power amplifier circuit in accordance with claim 2, wherein the $C_1$-$L_1$-$C_2$ LC network is connected to two terminal ends of the $L_0$-$C_0$ LC network.

19. The power amplifier circuit in accordance with claim 1, wherein $L_1$ is a grounded inductor.

* * * * *